United States Patent
Manipatruni et al.

(10) Patent No.: US 11,165,430 B1
(45) Date of Patent: Nov. 2, 2021

(54) MAJORITY LOGIC GATE BASED SEQUENTIAL CIRCUIT

(71) Applicant: Kepler Computing, Inc., San Francisco, CA (US)

(72) Inventors: Sasikanth Manipatruni, Portland, OR (US); Yuan-Sheng Fang, San Francisco, CA (US); Robert Menezes, Portland, OR (US); Rajeev Kumar Dokania, Beaverton, OR (US); Gaurav Thareja, Santa Clara, CA (US); Ramamoorthy Ramesh, Moraga, CA (US); Amrita Mathuriya, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

(21) Appl. No.: 17/129,842

(22) Filed: Dec. 21, 2020

(51) Int. Cl.
| | |
|---|---|
| *H03K 19/23* | (2006.01) |
| *H03K 19/00* | (2006.01) |
| *H03K 19/21* | (2006.01) |

(52) U.S. Cl.
CPC ......... *H03K 19/23* (2013.01); *H03K 19/0008* (2013.01); *H03K 19/21* (2013.01)

(58) Field of Classification Search
None
See application file for complete search history.

(56) References Cited

U.S. PATENT DOCUMENTS

| | | | | | |
|---|---|---|---|---|---|
| 5,835,045 | A | * | 11/1998 | Ogawa | H03M 1/42 341/155 |
| 5,926,057 | A | * | 7/1999 | Ogawa | G06J 1/00 327/359 |
| 6,166,583 | A | * | 12/2000 | Kochi | G06F 7/607 327/407 |
| 2001/0052619 | A1 | * | 12/2001 | Inoue | H01L 27/1203 257/347 |

OTHER PUBLICATIONS

"Kepler Logic", Named for Amalie Emmy Noether @ https://en.wikipedia.org/wiki/Emmy_Noether.
Fichtner, S. et al., "AlScN: A III-V semiconductor based ferroelectric", Journal of Applied Physics 125, 114103 (2019); https://doi.org/10.1063/1-5084945, 2019, 28 pages.

(Continued)

*Primary Examiner* — Jany Richardson
(74) *Attorney, Agent, or Firm* — Mughal IP P.C.

(57) ABSTRACT

A low power sequential circuit (e.g., latch) uses a non-linear polar capacitor to retain charge with fewer transistors than traditional CMOS sequential circuits. The sequential circuit includes a 3-input majority gate having first, second, and third inputs, and a first output. The sequential circuit includes a driver coupled to the first output, wherein the driver is to generate a second output. The sequential circuit further includes an exclusive-OR (XOR) gate to receive a clock and the second output, wherein the XOR gate is to generate a third output which couples to the second input, where the first input is to receive a data, and wherein the third input is to receive the second output.

26 Claims, 27 Drawing Sheets

(56) References Cited

OTHER PUBLICATIONS

Muller, J et al., "Ferroelectric Hafnium Oxide Based Materials and Devices: Assessment of Current Status and Future Prospects", ECS Journal of Solid State Science and Technology, 4 (5) N30-N35 (215). 6 pages.
Muroga, S., "Threshold Logic and its Applications", New York, Wiley-Interscience, published 1971.
Subbarao, E., "Ferroelectric and antiferroelectric materials", Department of Metallurgical Engineering, Indian Institute of Technology, Kanpur, IN. First published Mar. 15, 2011. Ferroelectrics, 5:1,267-280.

\* cited by examiner

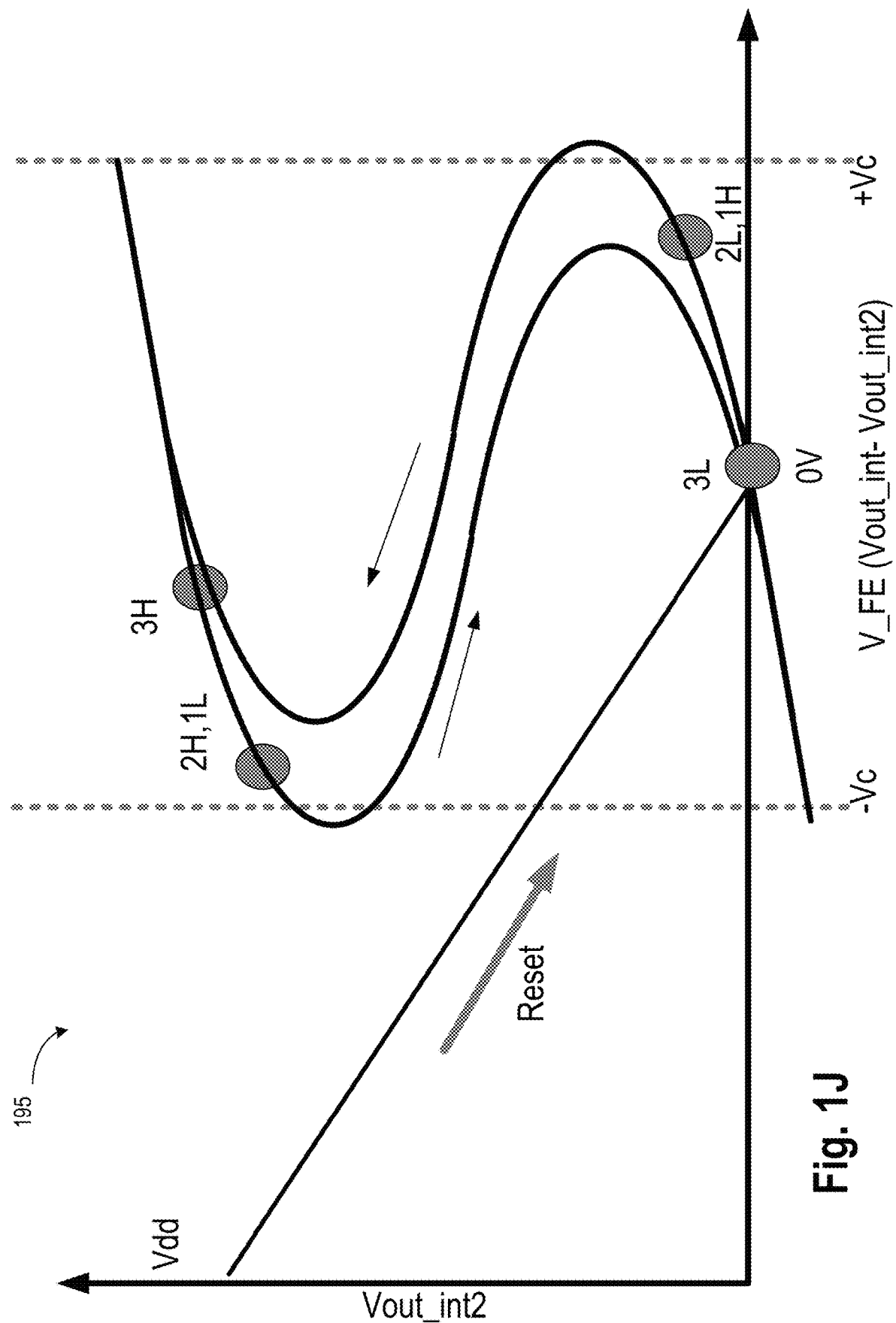

| Operation Mode | Clk | D | Qb | Qbd | Qb | Q |
|---|---|---|---|---|---|---|
| Transparent | 1 | Din | Din-inv | Din-inv | Din-inv | Din |
| Storage | 0 | Din | Din-inv | Qn-1-inv | Qn-1-inv | Qn-1 |
| Reset | 1 | 1 | 0 | 0 | 0->1->0 | 1 |

MAJORITY LOGIC GATE BASED SEQUENTIAL CIRCUIT

BACKGROUND

A sequential circuit is a logic circuit whose output is sampled by a clock. The output depends not only on the present value of an input (e.g., data) but also on the sequence of past inputs. As such, the input history plays a role in the value of the output. This is in contrast to combinational logic; whose output is a function of only the present input. Typical sequential circuit such as a flip-flop may consist of several gates and transistors to form master and slave stages and many interconnects to connect the various gates and transistors. These transistors and gates toggle regularly that increase the dynamic power consumption of the sequential circuit. As processors are pushing down the power envelope to save battery power, existing architectures for sequential circuits present challenges to the goal of lower power consumption.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1J illustrates plot showing the voltage on node Vout_int2 relating to the behavior of ferroelectric capacitor, in accordance with some embodiments.

FIG. 7 illustrates a table showing truth table of the low power sequential circuit of FIG. 6, in accordance with some embodiments.

DETAILED DESCRIPTION

Figure 1A:
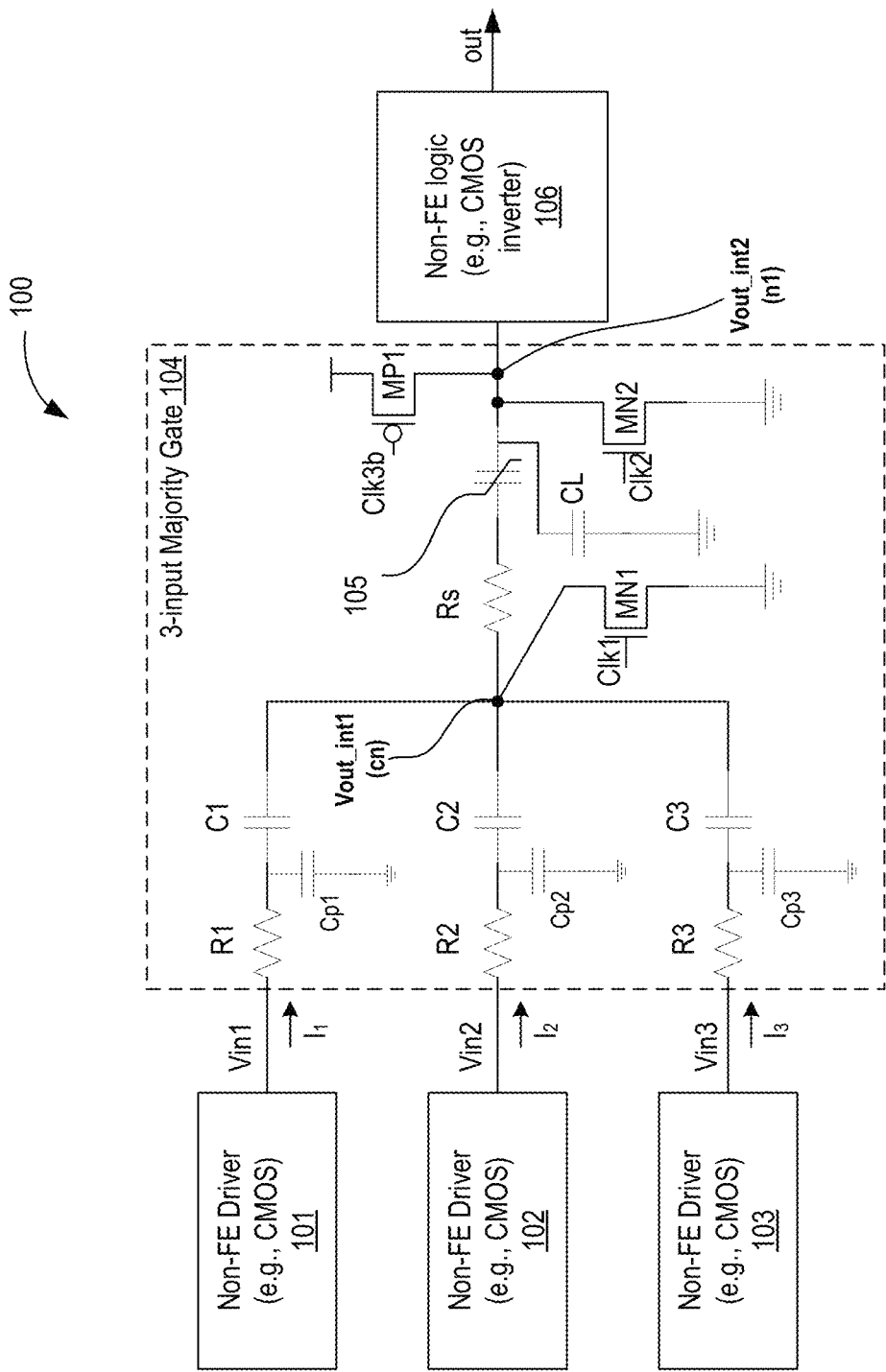
FIG. 1A illustrates a logic gate with a 3-input majority gate, in accordance with some embodiments.

Some embodiments describe a sequential circuit that uses a non-linear polar capacitor to retain charge. Unlike standard CMOS (Complementary Metal Oxide Semiconductor) based transistors where each transistor must be directly connected to a Source or Drain, in some embodiments, transistors are connected to a charged ferroelectric capacitor. In some embodiments, a sequential circuit comprises a 3-input majority gate having first, second, and third inputs, and a first output. The majority gate uses non-linear polar material and forms a new class of logic gates. In some embodiments, a threshold gate can be used instead of the majority gate.

Input signals in the form of analog, digital, or a combination of them are driven to first terminals of non-ferroelectric capacitors of the majority gate. The second terminals of the non-ferroelectric capacitors are coupled to form a majority node. Majority function of the input signals occurs on this node. The majority node is then coupled to a first terminal of a capacitor comprising non-linear polar material. The second terminal of the capacitor provides the output of the logic gate.

In some embodiments, the sequential circuit further comprises a driver coupled to the first output (e.g., output of the 3-input majority gate). The driver generates a second output. The driver can be any suitable logic gate such as a buffer, inverter, NAND gate, NOR gate, etc. Any suitable logic or analog circuit can drive the output and inputs of the majority logic gate. As such, the majority gate of various embodiments can be combined with existing transistor technologies such as complementary metal oxide semiconductor (CMOS), tunneling field effect transistor (TFET), GaAs based transistors, bipolar junction transistors (BJTs), Bi-CMOS transistors, etc.

In some embodiments, the sequential circuit comprises an exclusive-OR (XOR) gate to receive a clock and the second output. The XOR gate generates a third output which is coupled to the second input (of the 3-input majority gate), where the first input of the 3-input majority is to receive data (e.g., input data to be sampled), and where the third input (of the 3-input majority gate) is to receive the second output (e.g., output of the driver).

In some embodiments, the majority gate of the sequential circuit is replaced with a threshold gate. In a threshold gate, an additional fixed or programmable input is coupled to the majority node via another capacitor. This additional fixed or programmable input can be a positive or negative bias. The bias behaves as a threshold or offset added or subtracted to or from the voltage (or current) on the majority node and determines the final logic value of the logic gate. Depending on the polarity or voltage value of the bias, AND gate or OR logic gate functions are realized, in accordance with various embodiments.

In some embodiments, an apparatus is provided which comprises a 3-input majority logic gate and a driver coupled to the output of the 3-input majority logic gate. In some embodiments, the 3-input majority logic gate includes first, second, and third non-ferroelectric capacitors to receive a first input, a second input, and a third input, respectively. In some embodiments, the 3-input majority logic gate includes a non-linear polar capacitor to store a majority function output of the first, second, and third inputs, wherein one terminal of the non-linear polar capacitor provides an output of the 3-input majority logic gate. In some embodiments, the driver is to generate an amplified output of the 3-input majority logic gate, wherein the amplified output is coupled to the third input. In some embodiments, the apparatus comprises a compare logic to receive a clock and the amplified output, wherein an output of the compare logic gate is the second input.

In some embodiments, the first input is a data input. In some embodiments, the driver comprises one of: a buffer, an amplifier, NAND, AND, OR, multiplexer, or NOR logic gates, wherein the compare logic comprises an exclusive-OR (XOR) gate. In some embodiments, the apparatus comprises: a first transistor coupled to a first terminal of the non-linear polar capacitor, wherein the first transistor is controllable by a first clock; a second transistor coupled to a second terminal of the non-linear polar capacitor, wherein the second transistor is controllable by a second clock; and a third transistor coupled to the second terminal of the non-linear polar capacitor, wherein the third transistor is controllable by a third clock.

In some embodiments, the first clock has a pulse width greater than a pulse width of the second clock and a pulse width of the third clock. In some embodiments, the third clock de-asserts prior to an assertion of the second clock. In some embodiments, the first transistor is a first n-type transistor, wherein the second transistor is a second n-type transistor, and wherein the third transistor is a p-type transistor. In some embodiments, the first transistor, the second transistor, and the third transistor are disabled in an evaluation phase, and enabled in a reset phase, wherein the reset phase is prior to the evaluation phase. In some embodiments, the first and second signals are the same, and wherein the first and second signals are reset signals. In some embodiments, the first and second signals are different signals. In some embodiments, the apparatus comprises: a first driver to generate the first input; and a second driver to generate the clock. In some embodiments, the first and second drivers comprise CMOS transistors. In some embodiments, the first, second, and third non-ferroelectric capacitors of the 3-input majority logic gate comprise one of: metal-insulator-metal (MIM) capacitor, transistor gate capacitor, hybrid of metal and transistor capacitor; or capacitor comprising para-electric material.

In some embodiments, the non-linear polar capacitor includes one of: ferroelectric material, para-electric material, or non-linear dielectric material. In some embodiments, the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La or Nb; a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST). In some embodiments, perovskite ferroelectrics includes one of: BaTiO3, PbTiO3, KNbO3, or NaTaO3. In some embodiments, hexagonal ferroelectric includes one of: YMnO3 or LuFeO3. In some embodiments, hexagonal ferroelectrics of a type h-RMnO3, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides of a form, Hf1−x Ex Oy where E can be Al, Ca, Ce, Dy, er, Gd, Ge, La, Sc, Si, Sr, Sn, or Y; Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100. In some embodiments, the non-linear polar capacitor is positioned in a backend of a die, while transistors of the driver and the compare logic are positioned in a frontend of a die.

There are many technical effects of the various embodiments. For example, extremely compact sequential circuit is formed using the non-ferroelectric capacitors and a capacitor with non-linear polar material. The non-linear polar material can be ferroelectric material, para-electric material, or non-linear dielectric. The majority gate and/or threshold gate of various embodiments lowers the power consumption of a sequential circuit because majority gate and/or threshold gate do not use switching transistors and the interconnect routings are much fewer than the interconnect routings used in transitional CMOS logic gates. For example, 10× fewer interconnect length is used by the majority gate and threshold gate of various embodiments than traditional CMOS circuits for the same function and performance. The capacitor with non-linear polar material provides non-volatility that allows for intermittent operation and zero power drain when not in use.

For example, a processor having such sequential logic gates can enter and exit various types of low power states without having to worry about losing data. Since the capacitor with non-linear polar material can store charge from low energy devices, the entire processor can operate at much lower voltage level from the power supply, which reduces overall power of the processor. Further, very low voltage switching (e.g., 100 mV) of the non-linear polar material state allows for low swing signal switching, which in turn results in low power.

The capacitor with non-linear polar material can be used with any type of transistor. For example, the capacitor with non-linear polar material of various embodiments can be used with planar or non-planar transistors. The transistors can be formed in the frontend or backend of a die. The capacitors with non-linear polar material can be formed in the frontend or backend of the die. As such, the logic gates can be packed with high density compared to traditional logic gates. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +1-10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1A illustrates logic gate 100 with a 3-input majority gate, in accordance with some embodiments. Logic Gate 100 comprises first, second, and third drivers 101, 102, and 103, respectively. These drivers can be analog drivers generating analog signals or digital drivers generating signals that toggle between ground and the power supply rail, or a combination of analog or digital drivers. For example, driver 101 is a CMOS driver such as a buffer, an inverter, a NAND gate, NOR gate, etc., while driver 102 is an amplifier generating a bias signal. The drivers provide input signals Vin1 (and current $I_1$), Vin2 (and current $I_2$), and Vin3 (and current $I_3$) to the three inputs of 3-input majority gate 104.

In various embodiments, 3-input majority gate 104 comprises three input nodes Vin1, Vin2, and Vin3. Here, signal names and node names are interchangeably used. For example, Vin1 refers to node Vin1 or signal Vin1 depending on the context of the sentence. 3-input majority gate 104 further comprises capacitors C1, C2, and C3. Here, resistors R1, R2, and R3 are interconnect parasitic resistances coupled to capacitors C1, C2, and C3 respectively. In various embodiments, capacitors C1, C2, and C3 are non-ferroelectric capacitors. In some embodiments, the non-ferroelectric capacitor includes one of: dielectric capacitor, para-electric capacitor, or non-linear dielectric capacitor.

A dielectric capacitor comprises first and second metal plates with a dielectric between them. Examples of such dielectrics are: HfO, ABO3 perovskites, nitrides, oxy-fluorides, oxides, etc.

A para-electric capacitor comprises first and second metal plates with a para-electric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95)), HfZrO2, Hf—Si—O, La-substituted PbTiO3, PMN-PT based relaxor ferroelectrics.

A dielectric capacitor comprises first and second metal plates with non-linear dielectric capacitor between them. The range for dielectric constant is 1.2 to 10000. The capacitors C1, C2, and C3 can be implemented as MIM (metal-insulator-metal) capacitor technology, transistor gate capacitor, hybrid of metal capacitors or transistor capacitor.

One terminal of the capacitors C1, C2, and C3 is coupled to a common node cn. This common node is coupled to node n1, which is coupled to a first terminal of a non-linear polar capacitor 105. The majority function is performed at the common node cn, and the resulting voltage is projected on to capacitor 105. For example, the majority function of the currents ($I_1$, $I_2$, and $I_3$) on node cn results in a resultant current that charges capacitor 105. Table 1 illustrates the majority function f(Majority Vin1, Vin2, Vin3).

TABLE 1

| Vin1 | Vin2 | Vin3 | cn (f(Majority Vin1, Vin2, Vin3)) |
|------|------|------|-----------------------------------|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

A capacitor with FE material (also referred to as a FEC) is a non-linear capacitor with its potential $V_F(Q_F)$ as a cubic function of its charge. FIG. 1C illustrates plot 130 showing characteristics of a FEC. Plot 130 is a charge-voltage (Q-V) plot for a block f Pb(Zr$_{0.5}$Ti$_{0.5}$)O$_3$ of area (100 nm)$^2$ and thickness 20 nm (nanometer). Plot shows local extrema at +/−$V_o$ indicated by the dashed lines. Here, the term $V_c$ is the coercive voltage. In applying a potential V across the FEC, its charge can be unambiguously determined only for |V|>$V_o$. Otherwise, the charge of the FEC is subject to hysteresis effects.

Referring back to FIG. 1A, in some embodiments, N odd number of capacitors are coupled to a single FEC to form a majority gate. In this case, N=3. The measured charge on the FEC ($Q_F$) is the output of the majority gate. Solving for a steady-state solution, the parasitic resistors are ignored and the input potentials $V_i$ (or Vin) are assumed to be constant. In this case, the charge across each linear capacitor (C1, C2, C3) is:

$$Q_i = C_i \cdot (V_i - V_F) \quad (1)$$

The charge summed at node Cn and across FEC 105 is expressed as:

$$Q_F = \sum_i Q_i \quad (2)$$

$$Q_F = \sum_i C_i V_i - \sum_i C_i V_F \quad (3)$$

$$Q_F = \sum_i C_i V_i - C V_F(Q_F) \quad (4)$$

$$V_F(Q_F) = \sum_i \frac{C_i}{C} V_i - \frac{Q_F}{C} \quad (5)$$

Here, $C = \sum_i C_i$ is the sum of the capacitances. In the limit, $C \to \infty$, the following is achieved:

$$V_F(Q_F) = \sum_i \frac{C_i}{C} V_i = \overline{V} \quad (6)$$

The potential across FEC 105 is the average of all the input potentials weighted by the capacitances (e.g., C1, C2, and C3).

When $C_i = C/N$ are all equal, $V_F$ is just a simple mean. To ensure that $$Q_F = V_F^{-1}(\overline{V}) \quad (7)$$

is well defined, all possible values of V have magnitudes greater than $V_c$, the coercive potential. Assuming binary input of $+/-V_s$, the potential with the smallest magnitude is:

$$\overline{V} = V_s/N \quad (8)$$

This occurs when (N+1)/2 of the inputs are $+V_s$ and (N−1)/2 are $−V_s$. Then, $$V_s > N V_C \quad (9)$$

Figure 1B:
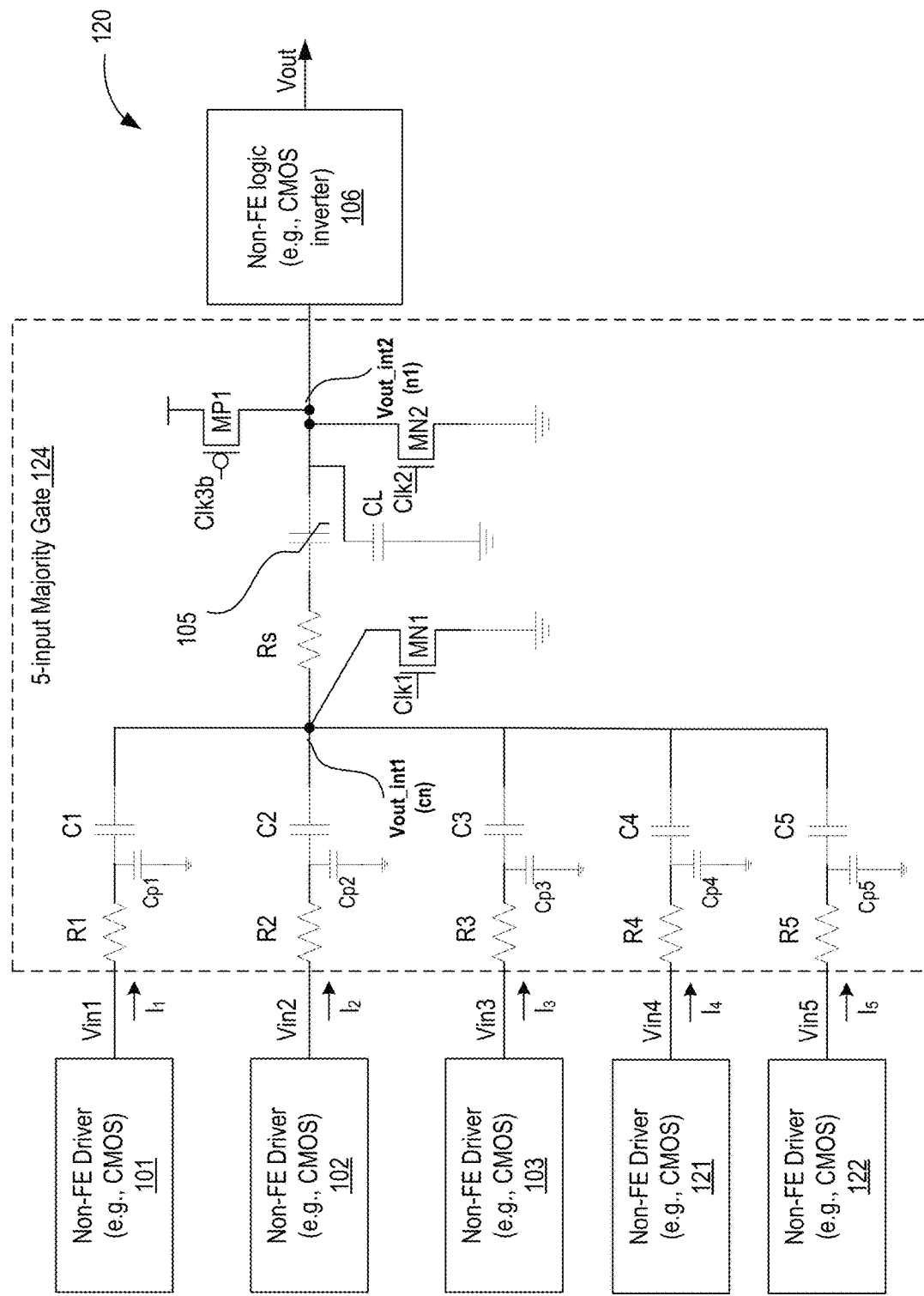
FIG. 1B illustrates a logic gate with a 5-input majority gate, in accordance with some embodiments.
Figure 1C:
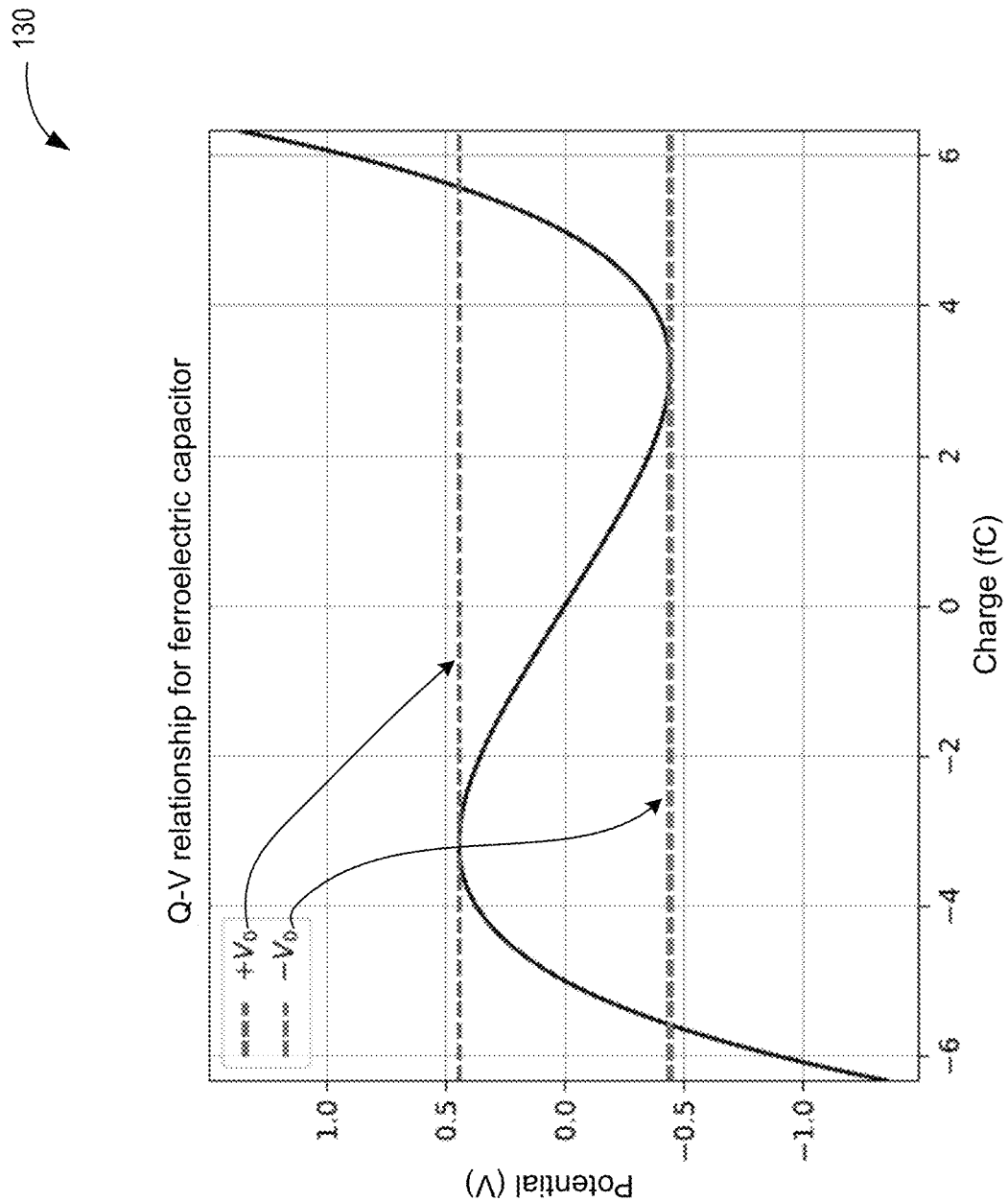
FIG. 1C illustrates a plot showing characteristics of a ferroelectric capacitor.
Figure 1D:
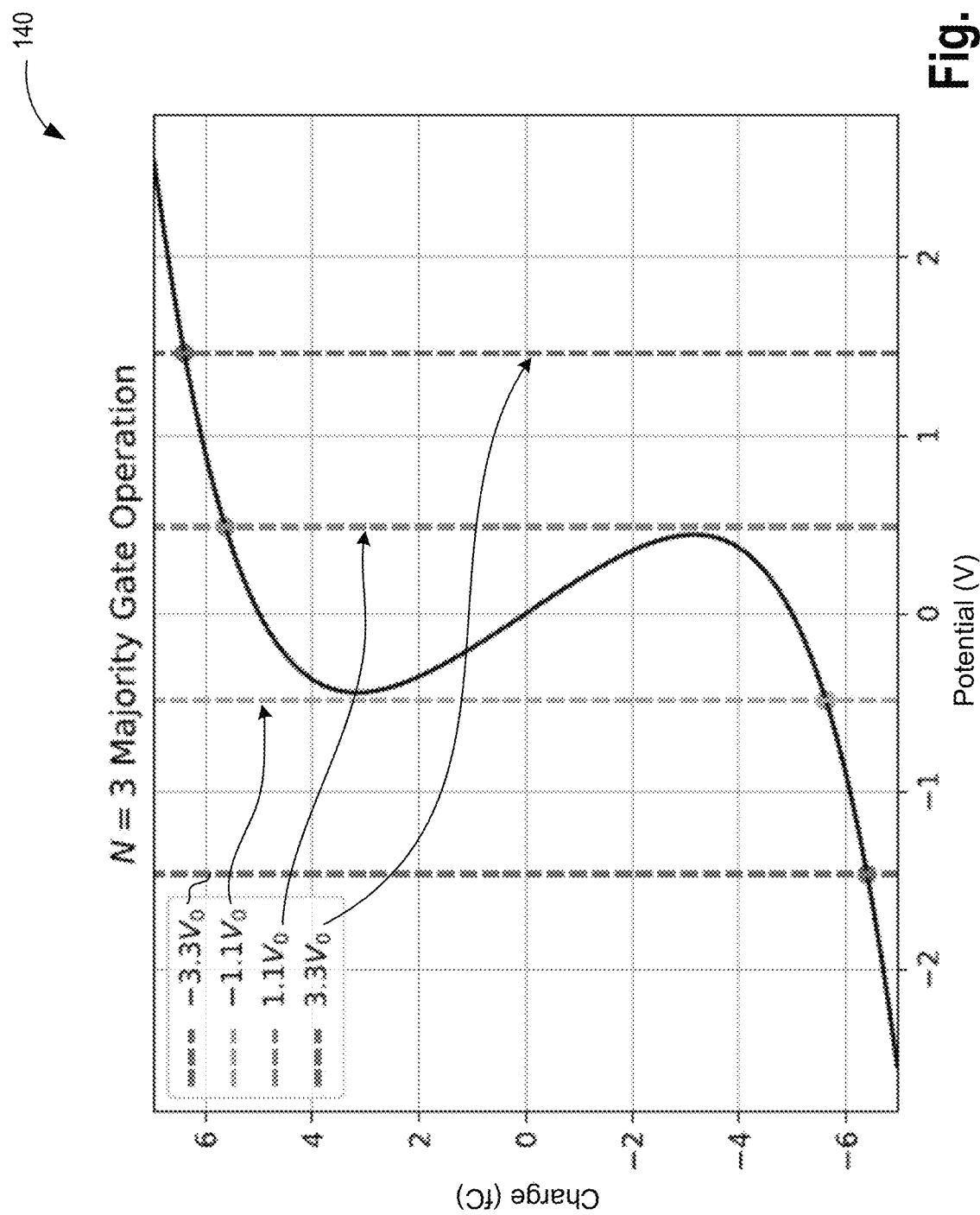
FIG. 1D illustrates a plot showing the output of a 3-input majority gate, in accordance with some embodiments.

The output of the majority gate at node n1 is expressed by FIG. 1D. FIG. 1D illustrates plot 140 showing the output of a 3-input majority gate, in accordance with some embodiments.

As an example, for N=3, the possible inputs are:

$$\overline{V} \in \left\{ -\frac{3}{3} V_s, -\frac{1}{3} V_s, +\frac{1}{3} V_s, +\frac{3}{3} V_s \right\} \quad (10)$$

Referring back to FIG. 1A, since capacitor 105 is a non-linear polar capacitor, both terminals of the capacitor are pre-discharged to ground or to a known predetermined voltage via n-type transistors pull-down transistors MN1 and MN2, and p-type pull-up transistors. The predetermined voltage can be programmable. The pre-determined voltage can be positive or negative. In some embodiments, n-type transistor MN1 is coupled to node Vout_int1 (internal Vout node) and is controllable by clock or reset signal Clk1. In some embodiments, n-type transistor MN2 is coupled to node Vout_int2 (internal Vout node) and is controllable by clock or reset signal Clk2. In some embodiments, p-type transistor MP1 is coupled to node Vout_int2, and is controllable by Clk3*b*.

In some embodiments, the n-type transistors MN1 and MN2 are replaced with p-type transistors to pre-charge both terminals (Vout_int1 and Vout_int2) of capacitor 105 to a supply voltage or another predetermined voltage, while the p-type transistor MP1 is replaced with an n-type transistor coupled to ground or a negative supply rail. The predetermined voltage can be programmable. The pre-determined voltage can be positive or negative.

Figure 1E:
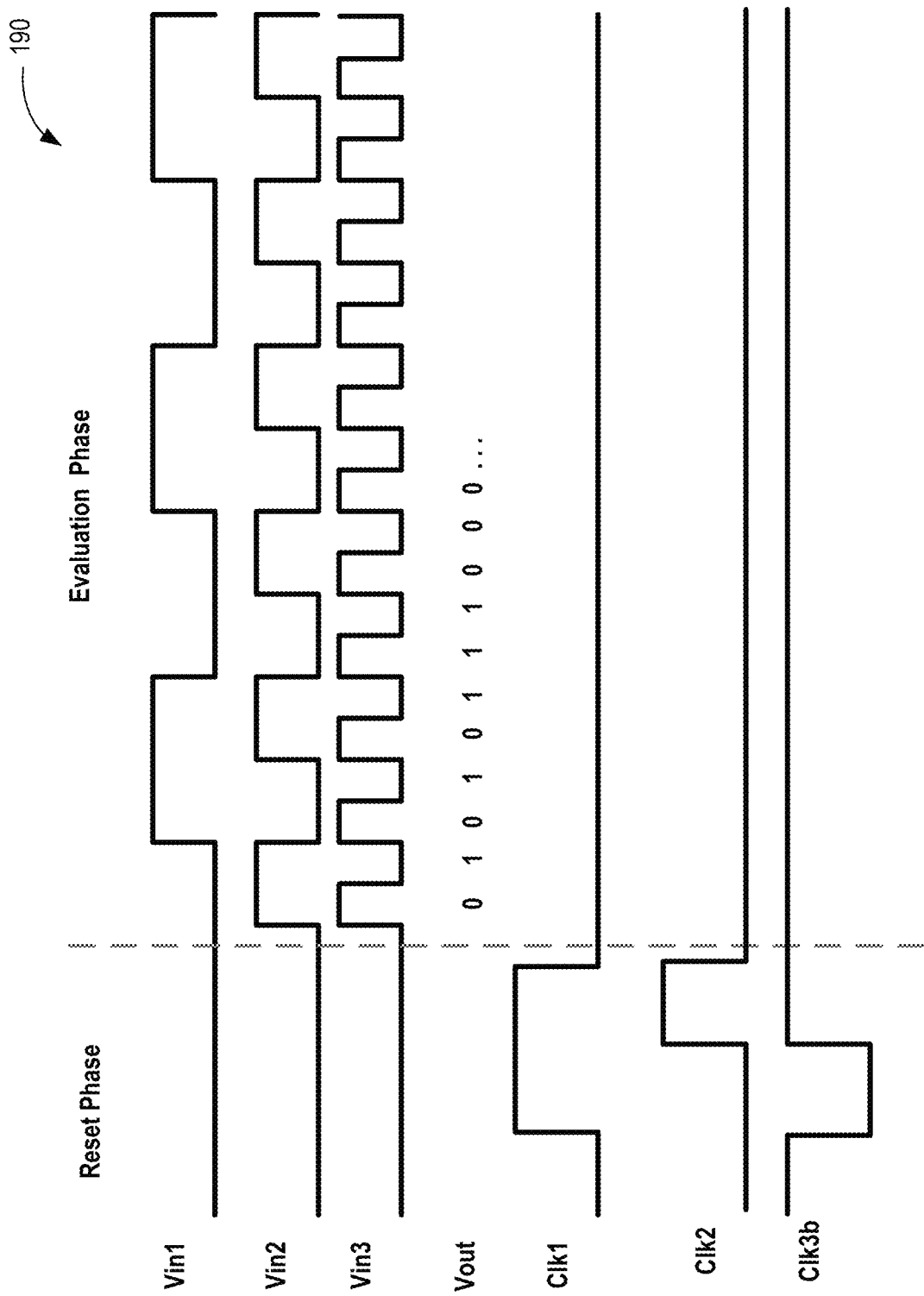
FIG. 1E illustrates a timing diagram for resetting the ferroelectric capacitor for majority gates of FIGS. 1A-B, in accordance with some embodiments.

In some embodiments, the pre-charge or pre-discharge of the terminals of capacitor 105 (or nodes cn and n1) is done periodically by clock signals Clk1, Clk2, and Clk3*b*. The controls can be a non-clock signal that is generated by a control logic (not shown). For example, the control can be issued every predetermined or programmable time. In some embodiments, clock signals Clk1, Clk2, and Clk3*b* are issued in a reset phase, which is followed by an evaluation phase where inputs Vin1, Vin2, and Vin3 are received and majority function is performed on them. FIG. 1E illustrates timing diagram 190 for resetting the ferroelectric capacitor for majority gates of FIGS. 1A-B, in accordance with some embodiments.

Clk1 has a pulse larger than the pulse widths of Clk2 and Clk3*b*. Clk3*b* is an inverse of Clk3 (not shown). In some embodiments, Clk1 is first asserted which begins to discharge node Vout_int1. While node Vout_int1 is being discharged, Clk2 is asserted. Clk2 may have a pulse width which is substantially half of the pulse width of Clk1. When Clk2 is asserted, node Vout_int2 is discharged. This sequence assures that both terminals of the non-linear polar material of capacitor 105 are discharged sequentially. In various embodiments, before discharging node Vout_int2, Clk3*b* is de-asserted which turns on transistor MP1, causing Vout_int2 to be charged to a predetermined value (e.g., supply level). The pulse width of Clk3*b* is smaller than the pulse width of clk1 to ensure the Clk3*b* pulsing happens within the Clk1 pulse window. This is useful to ensure non-linear polar capacitor 105 is initialized to a known programmed state along with the other capacitors (e.g., C1, C2, C3) which are initialized to 0 V across them. The pulsing on Vout_int2 creates the correct field across the non-linear polar capacitor 105 in conjunction with Vout_int1 to put it in the correct state, such that during operating mode, if Vout_int1 goes higher than Vc value (coercive voltage value), it triggers the switching for non-linear polar capacitor 105, thereby resulting into a voltage build up on Vout_int2.

In some embodiments, load capacitor CL is added to node Vout_int2. In some embodiments, load capacitor CL is a regular capacitor (e.g., a non-ferroelectric capacitor). The capacitance value of CL on Vout_int2 is useful to ensure that the FE switching charge (of FE capacitor 105) provides the right voltage level. For a given FE size (area A), with polarization switching density (dP) and desired voltage swing of Vdd (supply voltage), the capacitance of CL should be approximately CL=dP*A/Vdd. There is slight deviation from the above CL value as there is charge sharing on Vout_int2 due to dielectric component of FE capacitor 105. The charge sharing responds relative to voltage on Vout_int1, and capacitor divider ratio between the dielectric component of the FE capacitor 105, and load capacitor (CL). Note, the capacitance of CL can be an aggregate of all the capacitances (e.g., parasitic routing capacitance on the node, gate capacitance of the output stage 106, and drain or source capacitance of the reset devices (e.g., MN2, MP1) on the Vout_int2 node. In some embodiments, for a given size of non-linear polar capacitor 105, CL requirement can be met by just the load capacitance of Non-FE logic 106, and parasitic component itself, and may not need to have it as a separate linear capacitor.

Referring back to FIG. 1A, in some embodiments, the non-linear polar material of capacitor 105 includes one of: ferroelectric (FE) material, para-electric material, relaxor ferroelectric, or non-linear dielectric. In various embodiments, para-electric material is same as FE material but with chemical doping of the active ferroelectric ion by an ion with no polar distortion. In some cases, the non-polar ions are non-s orbital ions formed with p, d, and/or f external orbitals. In some embodiments, non-linear dielectric materials are same as para-electric materials, relaxors, and dipolar glasses.

In some embodiments, f-orbital materials (e.g., lanthanides) are doped to the ferroelectric material to make para-electric material. Examples of room temperature paraelectric materials include: SrTiO3, Ba(x)Sr(y)TiO3 (where x is −0.5, and y is 0.95), HfZrO2, Hf—Si—O, La-substituted PbTiO3, PMN-PT based relaxor ferroelectrics.

In various embodiments, the FE material can be any suitable low voltage FE material that allows the FE material to switch its state by a low voltage (e.g., 100 mV). In some embodiments, the FE material comprises a perovskite of the type ABO3, where 'A' and B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted BiFeO3, BiCrO3, BiCoO3 class of materials, La or rare earth substitution into the Bi site can tune the spontaneous distortion.

Threshold in the FE material has a highly non-linear transfer function in the polarization vs. voltage response. The threshold is related to a) non-linearity of switching transfer function, and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished by the use of lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, LaNiO3, and ReO3.

In some embodiments, the FE material comprises a stack of layers including low voltage FE material between (or sandwiched between) conductive oxides. In various embodiments, when FE material is a perovskite, the conductive oxides are of the type AA'BB'O$_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element including one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides adjacent to the FE material are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: Hafnium (Hf), Zirconium (Zr), Aluminum (Al), Silicon (Si), their oxides or their alloyed oxides. In some embodiments, FE material includes one of: Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes Bismuth ferrite (BFO), lead zirconate titanate (PZT), BFO with doping material, or PZT with doping material, wherein the doping material is one of Nb or relaxor ferroelectrics such as PMN-PT.

In some embodiments, the FE material includes Bismuth ferrite (BFO), BFO with a doping material wherein the doping material is one of Lanthanum, or any element from the lanthanide series of the periodic table. In some embodiments, the FE material 105 includes lead zirconium titanate (PZT), or PZT with a doping material, wherein the doping material is one of La, or Nb. In some embodiments, the FE material includes a relaxor ferro-electric which includes, one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST).

In some embodiments, the FE material includes Hafnium oxides of the form, Hf1−x Ex Oy where E can be Al, Ca, Ce, Dy, Er, Gd, Ge, La, Sc, Si, Sr, Sn, or Y. In some embodiments, FE material 105 includes Niobate type compounds LiNbO3, LiTaO3, Lithium iron Tantalum Oxy Fluoride, Barium Strontium Niobate, Sodium Barium Niobate, or Potassium strontium Niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, the FE material comprises organic material. For example, Polyvinylidene fluoride or polyvinylidene difluoride (PVDF).

The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include Indium Tin Oxide (ITO) such as Sn-doped In2O3.

The charge developed on node n1 produces a voltage and current that is the output of the majority gate 104. Any suitable driver 106 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, etc. In some embodiments, output "out" is reset by driver 106 via Clk1 signal. For example, NAND gate with one input coupled to Vout_int2 and the other input coupled to Clk1 can be used to reset "out" during a reset phase.

While FIG. 1A illustrates a 3-input majority gate, the same concept can be extended to more than 3 inputs to make an N-input majority gate, where N is greater than 2.

FIG. 1B illustrates logic gate 120 with 5-input majority gate 124, in accordance with some embodiments. 5-input majority gate 124 is similar to 3-input majority gate 104 but for additional inputs Vin4 and Vin5. These inputs can come from the same drivers (e.g., any one of drivers 101, 102, 103) or from different drivers such as driver 121 and 122. Input Vin4 and Vin5 can be analog, digital, or a combination of them. For example, Vin4 is a digital signal while Vin5 is an analog signal. The additional inputs Vin4 and Vin5 are coupled to additional non-ferroelectric capacitors C4 and C5, respectively. The composition and size of the capacitors C4 and C5 is similar to that of C1, C2, and C3. Here, resistors R4 and R5 are parasitic resistors.

The majority function is performed at the common node cn, and the resulting voltage is projected on to capacitor 105. For example, the majority function of the currents ($I_1$, $I_2$, $I_3$, $I_4$, and $I_5$) on node cn results in a resultant current that charges capacitor 105. Table 2 illustrates the majority function f(Majority Vin1, Vin2, Vin3, Vin4, Vin5) of 5-input majority gate 124.

TABLE 2

| Vin1 | Vin2 | Vin3 | Vin4 | Vin5 | cn (f(Majority Vin1, Vin2, Vin3, Vin4, Vin5)) |
| --- | --- | --- | --- | --- | --- |
| 0 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 0 |
| 0 | 0 | 1 | 0 | 1 | 0 |
| 0 | 0 | 1 | 1 | 0 | 0 |
| 0 | 0 | 1 | 1 | 1 | 1 |
| 0 | 1 | 0 | 0 | 0 | 0 |
| 0 | 1 | 0 | 0 | 1 | 0 |
| 0 | 1 | 0 | 1 | 0 | 0 |
| 0 | 1 | 0 | 1 | 1 | 0 |
| 0 | 1 | 1 | 0 | 0 | 0 |
| 0 | 1 | 1 | 0 | 1 | 1 |
| 0 | 1 | 1 | 1 | 0 | 1 |
| 0 | 1 | 1 | 1 | 1 | 1 |
| 1 | 0 | 0 | 0 | 0 | 0 |
| 1 | 0 | 0 | 0 | 1 | 0 |
| 1 | 0 | 0 | 1 | 0 | 0 |
| 1 | 0 | 0 | 1 | 1 | 1 |
| 1 | 0 | 1 | 0 | 0 | 0 |
| 1 | 0 | 1 | 0 | 1 | 1 |
| 1 | 0 | 1 | 1 | 0 | 1 |
| 1 | 0 | 1 | 1 | 1 | 1 |
| 1 | 1 | 0 | 0 | 0 | 0 |
| 1 | 1 | 0 | 0 | 1 | 1 |
| 1 | 1 | 0 | 1 | 0 | 1 |
| 1 | 1 | 0 | 1 | 1 | 1 |
| 1 | 1 | 1 | 0 | 0 | 1 |
| 1 | 1 | 1 | 0 | 1 | 1 |
| 1 | 1 | 1 | 1 | 0 | 1 |
| 1 | 1 | 1 | 1 | 0 | 1 |

Figure 1F:
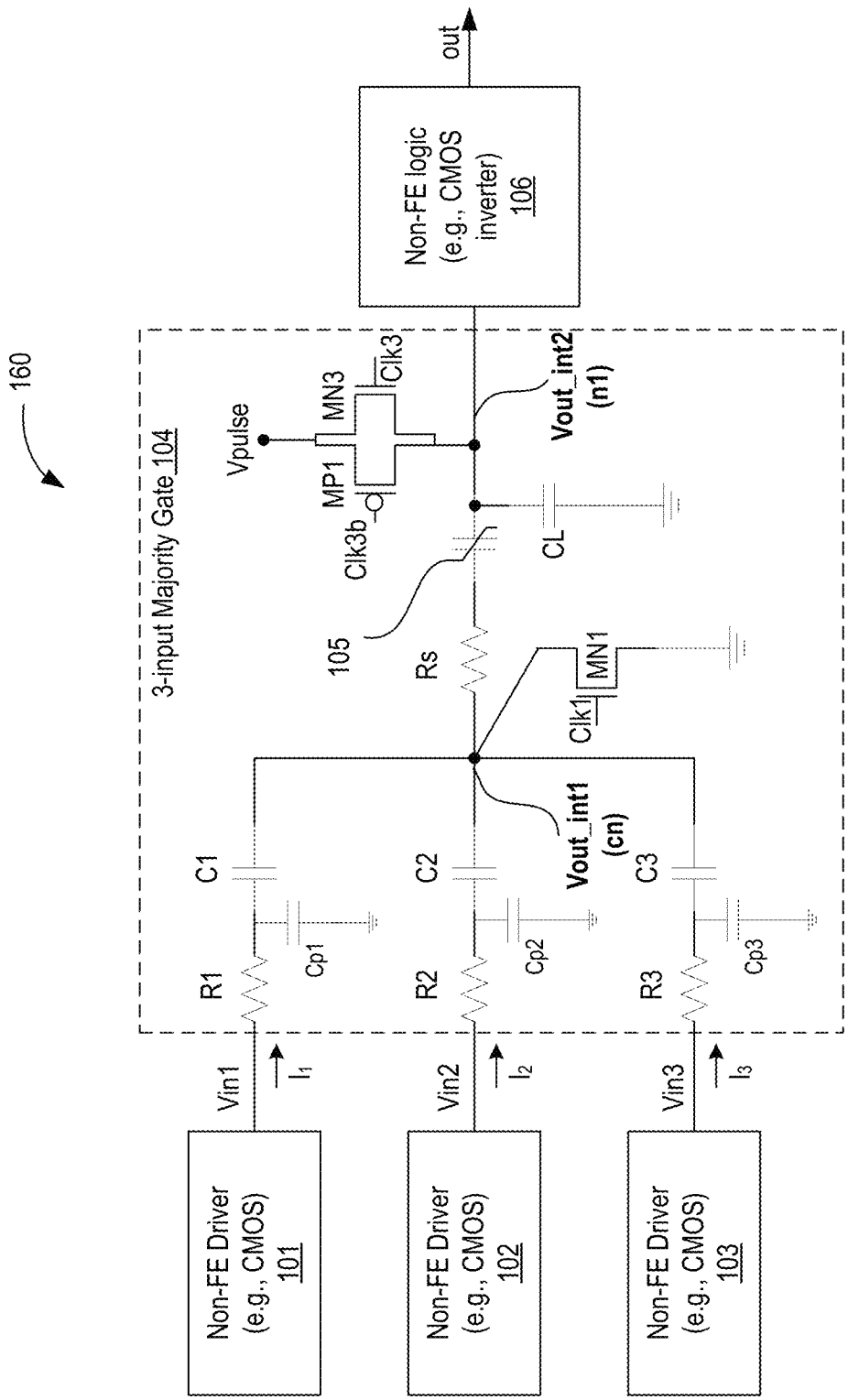
FIG. 1F illustrates a logic gate with a 3-input majority gate with pass-gate based resetting mechanism, in accordance with some embodiments.
Figure 1G:
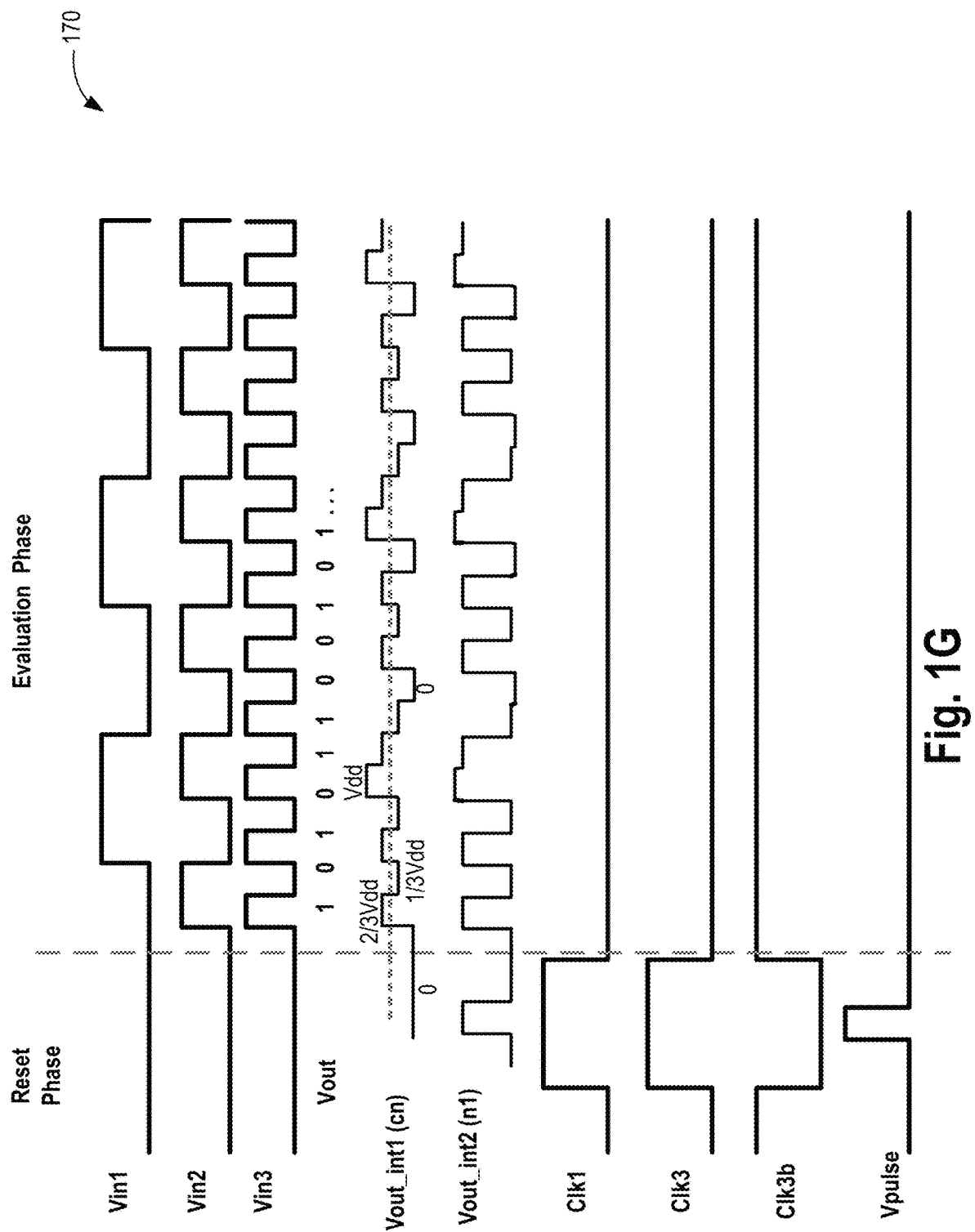
FIG. 1G illustrates a timing diagram for resetting the ferroelectric capacitor for the majority gate of FIG. 1F, in accordance with some embodiments.

FIG. 1F illustrates logic gate 180 with a 3-input majority gate with pass-gate based resetting mechanism, in accordance with some embodiments. Logic gate 180 is similar to logic gate 100 but for the reset mechanism to reset the terminals of non-linear polar capacitor 105. Here, pull-down transistor MN2 is removed and a pass-gate comprising p-type transistor MP1 and n-type transistor MN3 are coupled to Vout_int2 node. In some embodiments, transistor MN3 is controlled by Clk3 while transistor MP1 is controlled by Clk3b, where Clk3b is an inverse of Clk3. In some embodiments, Vpulse passes through the pass-gate to Vout_int2 when Clk1 and Clk3 are asserted and before Clk1 and Clk3 are de-asserted. Vpulse is generated during a reset phase, and is de-asserted during the evaluation phase as illustrated by FIG. 1G. FIG. 1G illustrates timing diagram 170 for resetting the ferroelectric capacitor for majority gate of FIG. 1F, in accordance with some embodiments.

During reset phase, node Vout_Int1 is first reset or discharged to ground by asserting a Clk1 pulse. In the same phase, transistors MP3 and MP1 are turned on, and Vpulse is applied to node Vout_Int2.

Here Vpulse eases out the relative timing control from the perspective of signal generation. Vpulse also minimizes charge injection on Vout_int2 node due to differential nature of switching that happens on the pass gate. Note, the pass-gate reduces the charge injection due to charge sharing as transistors MP1 and MN3 of the pass-gate approximately cancel the charge injection at Vout_int2 node due to switching event on the pass-gate. The gray dotted horizontal line shown for Vout_int1 (cn) node indicates where the Vc of FE capacitor 105 will create switching action. For majority gate design, in some embodiments, this gray dotted horizontal line is positioned close to Vdd/2 (e.g., Vc=Vdd/2), where Vdd is logic high value.

In some cases, when all inputs are zeros (e.g., Vin1=Vin2=Vin3=0 or Vss), which is referred to 3L, then the voltage on Vout_int1 and/or Vout_int1 may fall below Vss (or ground) level. The same may occur when all inputs are ones (e.g., Vin1=Vin2=Vin3=1 or Vss), which is referred to 3H, where the voltage on Vout_int1 and/or Vout_int1 may rise above Vdd (or supply) level. This, however, may depend on the exact amount of charge injection on the node cn at time 0 after assertion of the input signals. So, all three inputs being logic low (3L) translates into a slightly different levels compared to two inputs being logic low (2L). Here, 3H refers to all three inputs being high, 2H refers to two inputs being high and one input being low, and 1H refers to one input being high and two inputs being low. The same explanation is used for nomenclature 3L, 2L, and 1L. In the 1H case, the voltage on node cn and n1 may be slightly higher than ground. The same is the case with 3H which translates into slightly higher voltage level on nodes cn and/or n1 than in 2H and 1L cases.

Figure 1H:
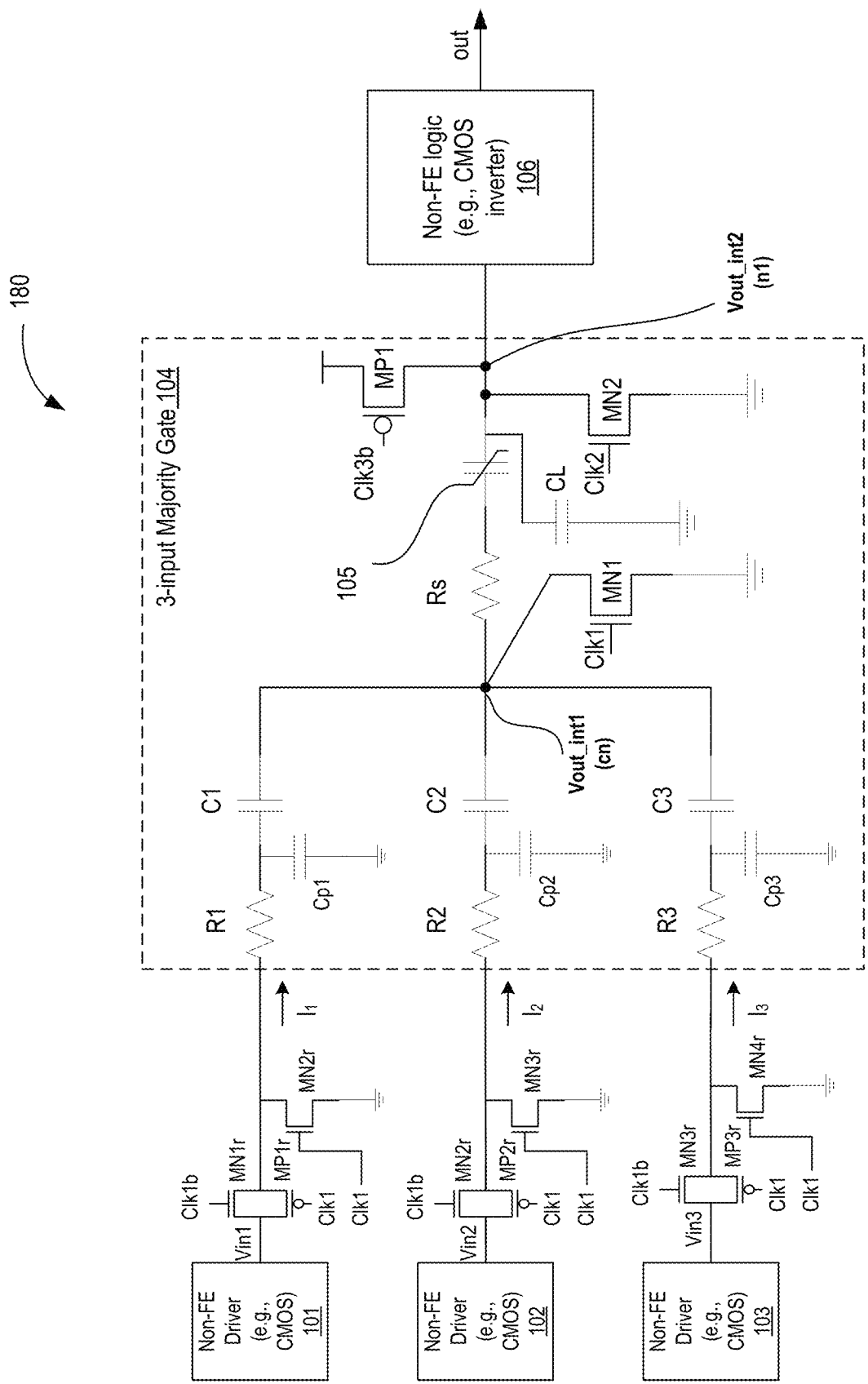
FIG. 1H illustrates a logic gate with a 3-input majority gate with input resetting mechanism, in accordance with some embodiments.

FIG. 1H illustrates logic gate 180 with a 3-input majority gate with input resetting mechanism, in accordance with some embodiments. Compared to the reset mechanisms described with reference to FIGS. 1A-B, and Figs. E-G, here the inputs (e.g., Vin1, Vin2, Vin3) are blocked from propagating during reset phase. Logic gate 180 is similar to logic gate 100 but for the determinism of input voltages during reset of capacitor 105.

In some embodiments, for reset mechanisms of FIGS. 1A-B, and Figs. E-G logic that generates input signals (e.g., Vin1 through Vin5) is aware of the reset timing, and as such ensures to send the right input signals (0 V in this illustration) for processing when capacitor 105 is being reset. Generating the input signals at predetermined voltage levels (e.g., 0 V) ensures predetermined voltage (e.g., 0V) across the linear capacitors (e.g., C1, C2, C3). When such predetermined input signals are generated, pass-gates on the input signal nodes can be removed to save area and cost.

In some other embodiments for multiple stages of these majority gates between a logic cluster, the reset sequencing can be controlled from input vectors to correctly create the correct voltage levels during the reset phase at each one of the stages. In some embodiments, a logic gate is provided at the input (e.g., Vin) such that correct voltage level at all stages are driving the right logic. For example, a NAND gate, with one of the inputs being a reset signal, and the other the logic level (e.g., Vin1), that ensures during reset phase the correct voltage level is applied at input of each one of the stages. In another example, the output of each logic is conditioned during reset to cause the subsequent logic (e.g., majority gate logic) to receive the correct input voltage level during reset. In one such example, non-FE logic 106 comprises a NAND gate with one of its inputs being a reset signal, and the other the logic level (e.g., coupled to Vout_int2), that ensures during reset phase the correct voltage level is propagated to the input of the next or subsequent majority gate stage.

In some embodiments, a first pass-gate is coupled to first capacitor C1 and driver that generates first input Vint. The first pass-gate comprises p-type transistor MP1r controllable by Clk1 and n-type transistor MN1r controllable by Clk1b. The first pass-gate blocks the propagation of Vin1 while pull-down transistor MN2r can set the input to capacitor C1 to ground via Clk1. In some embodiments, a second pass-gate is coupled to second capacitor C2 and driver that generates the second input Vin2. The second pass-gate comprises p-type transistor MP2r controllable by Clk1 and n-type transistor MN2r controllable by Clk1b. The second pass-gate blocks the propagation of Vin2 while pull-down transistor MN3r can set the input to capacitor C2 to ground via Clk1. In some embodiments, a third pass-gate is coupled to third capacitor C3 and driver that generates the third input Vin3. The third pass-gate comprises p-type transistor MP3r controllable by Clk1 and n-type transistor MN3r controllable by Clk1b. The third pass-gate blocks the propagation of Vin3 while pull-down transistor MN4r can set the input to capacitor C3 to ground via Clk1. The same technique is applied to other inputs.

Figure 1I:
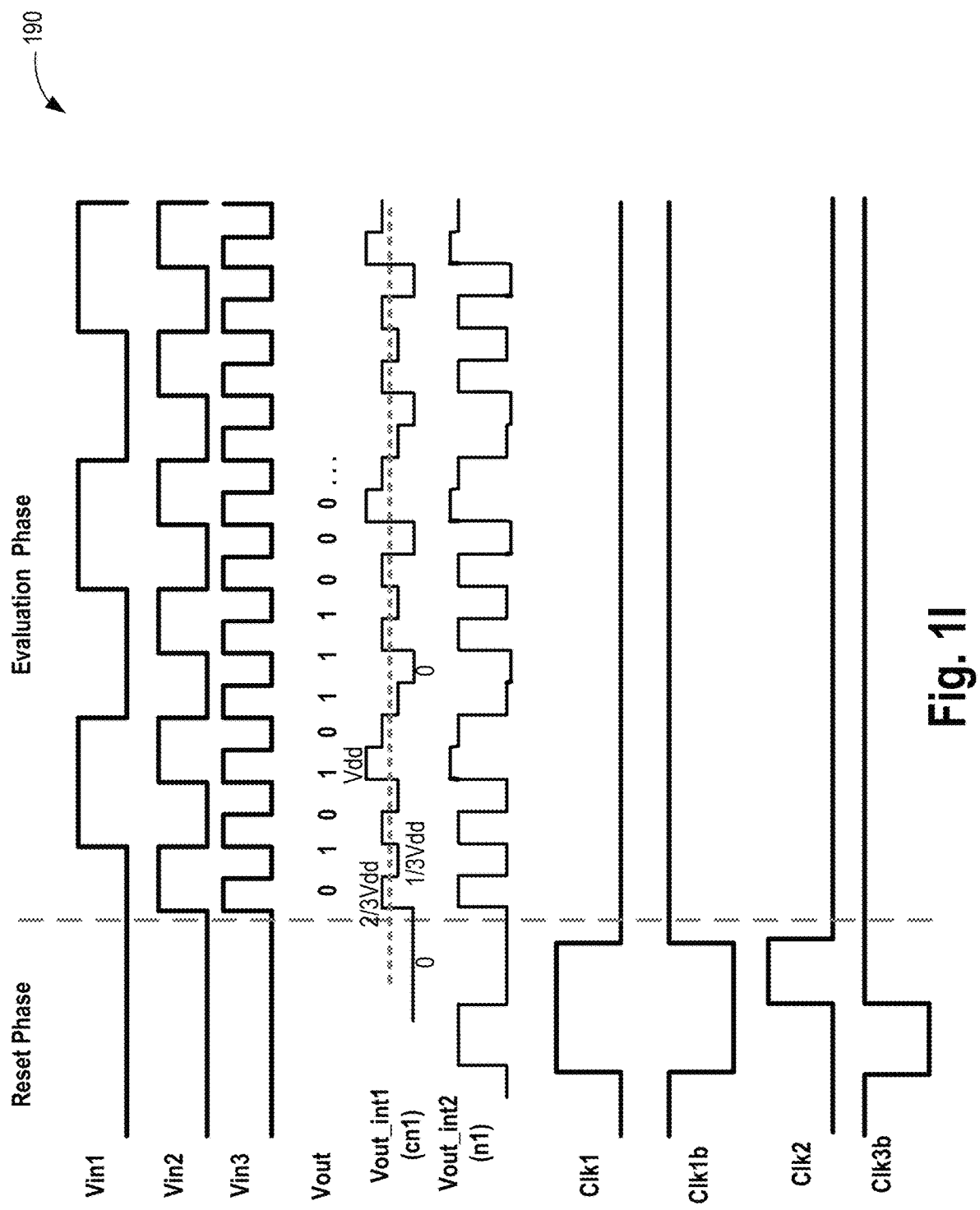
FIG. 1I illustrates a timing diagram for resetting the ferroelectric capacitor for majority gate of FIG. 1H, in accordance with some embodiments.

FIG. 1I illustrates timing diagram 190 for resetting the ferroelectric capacitor for majority gate of FIG. 1H, in accordance with some embodiments. During reset phase, Clk1 is asserted (and Clkb is de-asserted) to block the input voltages and to set the input to capacitor C1, C2, and C3 to ground. Assertion of Clk1 also discharges Vout_int1. As such, voltages on both terminals of input capacitors C1, C2, and C3 are discharged. Clk3b is initially (during reset phase) de-asserted to turn on MP1 to pre-charge Vout_int2. Thereafter, Clk2 is asserted to discharge Vout_int2.

The reset mechanism can be described in terms of two sequences of pulses. The first sequence of pulses is to create the right field across the FE capacitor 105 to initialize it in correct state for operation, while the second sequence of pulses ensures that all the nodes are initialized to 0 state, with all the linear caps (e.g., C1, C2, C3) having 0 V across them. The exact sequence also factors in glitch-less transition to minimize charge injection on high impedance nodes, and ensures that the ferroelectric device 105 does not see a transient due to reset pulsing that will compromise the initial programmed state for FE device 105.

The reset mechanism of various embodiments can also be described in terms of four phases. In the first phase (phase 1), linear capacitors (C1, C2, C3) are initialized to zero state using Clk1 (e.g., by asserting Clk1) and input conditioning (e.g., setting the inputs Vin1, Vin2, Vin3 to zero). In the second phase (phase 2), FE capacitor 105 continues to be initialized using Clk3b (e.g., de-asserting Clkb3) while keeping Clk1 high (e.g., Clk1 remains asserted). In the third phase (phase 3), Vout_int2 node and the dielectric component of FE capacitor 105 is initialized to zero state by de-asserting Clk2, asserting Clk3b, and while keeping Clk1 high (e.g., Clk1 remains asserted). In the fourth phase (phase 4), the reset switches are deactivated. For example, transistors MN1r, MP1r (and other pass-gate switches at the inputs) are turned on, MN2r (and other pull-down transistors) on the input nodes (e.g., Vin1, Vin2) are turned off, pull-down transistors MN1 and MN2 are disabled or turned off, pull-up transistors MP1 is disabled or turned off, Vpulse pass-gate having transistors MP1 and MN3 are disabled.

While the embodiments here are described with reference to resetting the FE device 105 to ground and/or resetting the two terminals of non-ferroelectric linear capacitors (C1, C2, C3) to ground, the resetting voltage can be different voltage other than ground. For example, when input signals (e.g., Vin1, Vin2, Vin3) toggle between a positive supply level and a negative supply level, then the two terminals of FE device 105 and/or the two terminals of non-ferroelectric linear capacitors (C1, C2, C3) are reset to the negative supply rail. For example, the definition of logic low and logic high to control the various reset devices changes to be positive and negative, respectively. So, if earlier rails were 0 V and Vdd and now they are negative to positive rails, the 0 V maps to negative and Vdd maps to positive.

FIG. 1J illustrates plot 195 showing the voltage on node Vout_int2 relating to the behavior of FE capacitor 105, in accordance with some embodiments. In this case, FE capacitor 105 stays within the window of Vc voltage drop across FE capacitor 105, but switching helps to generate different voltages on Vout_int2. For example, at time 0 during reset (when Clk1 is asserted and other signals such as Clk1b, Clk2, Clk3b, and Vpulse behave according to FIG. 1G and FIG. 1I), large reset field puts FE capacitor 105 in low state, and then FE capacitor 105 bounces between +Vc, and −Vc.

Figure 2A:
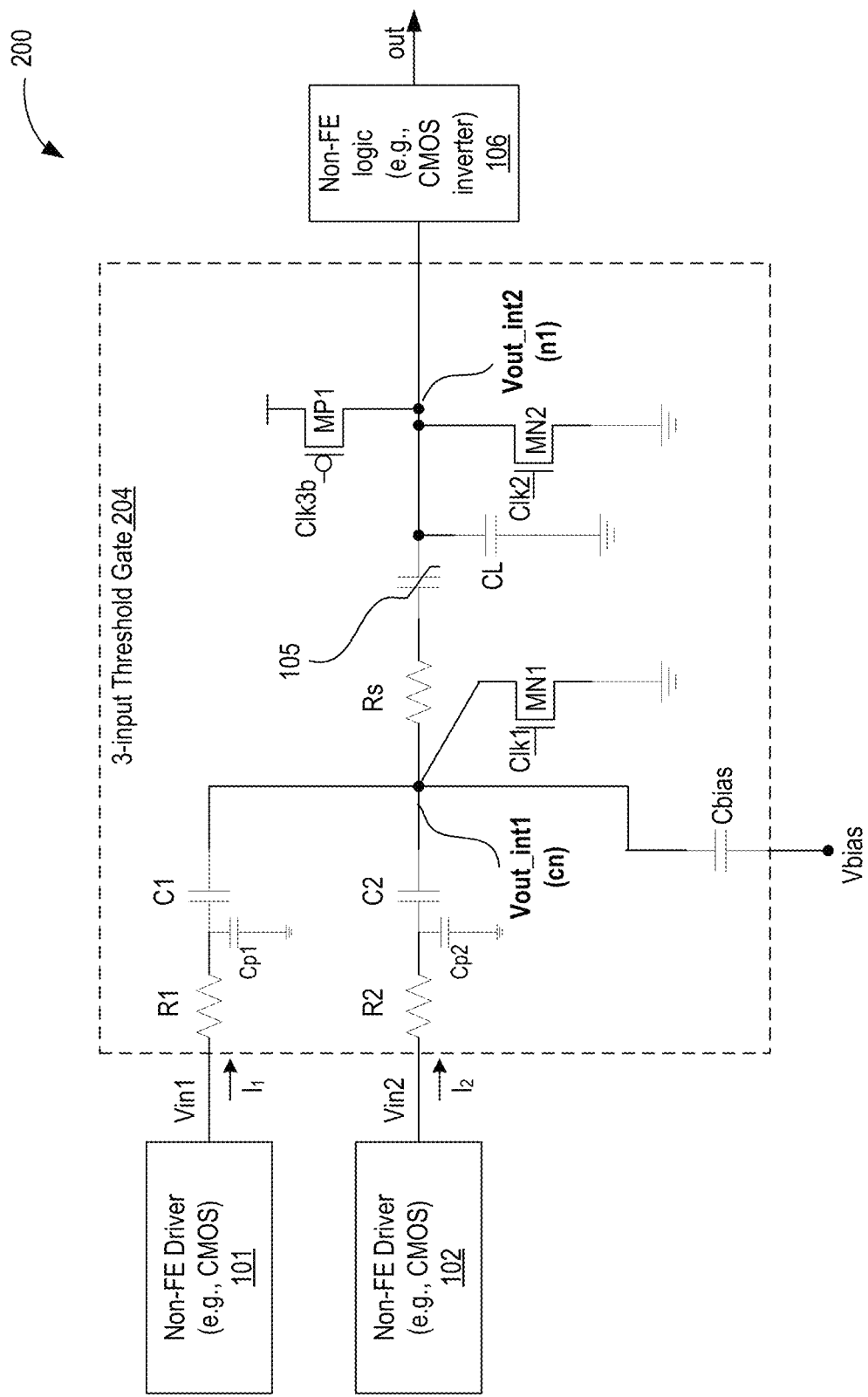
FIG. 2A illustrates a logic gate with a 3-input threshold gate which can operate as an AND or OR gate, in accordance with some embodiments.

FIG. 2A illustrates logic gate 200 with 3-input threshold gate 204 which can operate as an AND or OR gate, in accordance with some embodiments. Logic gate 200 is similar to logic gate 100 but for removing the third input Vin and adding an input Vbias. This additional input bias makes the logic gate a threshold gate 204. Threshold gate 204 is referred to as a 3-input threshold gate because of the three inputs Vin1, Vin2, and Vbias. It can also be referred to as 2-input threshold gate if the Vbias input is not counted as a separate input. In various embodiments, threshold gate 204 comprises an additional capacitor Cbias that has one terminal coupled to node cn and another terminal coupled to Vbias. The material for capacitor Cbias can be same as the material for capacitors C1, C2, and C3. For example, capacitor Cbias comprises non-ferroelectric material.

Vbias can be positive or negative voltage depending on the desired logic function of threshold gate 204. Any suitable source can generate Vbias. For example, a bandgap reference generator, a voltage divider such as a resistor divider, a digital to analog converter (DAC), etc. can generate Vbias. Vbias can be fixed or programmable (or adjustable). For example, Vbias can be adjusted by hardware (e.g., fuses, register), or software (e.g., operating system). In some embodiments, when Vbias is positive, the majority function on node cn is an OR function. For example, the function at node cn is OR(Vin1, Vin2, 0). In some embodiments, when Vbias is negative, the majority function on node cn is an AND function. For example, the function at node cn is AND(Vin1, Vin2, 1). Table 2 and Table 3 summarizes the function of threshold gate 206.

TABLE 3

| Vin1 | Vin2 | Vbias | cn OR(Vin1, Vin2, Vbias) |
|---|---|---|---|
| 0 | 0 | Positive or logic 1 | 0 |
| 0 | 1 | Positive or logic 1 | 1 |
| 1 | 0 | Positive or logic 1 | 1 |
| 1 | 1 | Positive or logic 1 | 1 |

TABLE 4

| Vin1 | Vin2 | Vbias | cn AND(Vin1, Vin2, Vbias) |
|---|---|---|---|
| 0 | 0 | Negative or logic 0 | 0 |
| 0 | 1 | Negative or logic 0 | 0 |
| 1 | 0 | Negative or logic 0 | 0 |
| 1 | 1 | Negative or logic 0 | 1 |

Compared to transitional CMOS AND logic gate and OR logic gate, here the AND and OR functions are performed by a network of capacitors. The output of the majority or threshold function on node cn is then stored in the non-linear polar capacitor 105. This capacitor provides the final state of the logic in a non-volatile form. As such, the logic gate of various embodiments describes a non-volatile multi-input AND or OR gate with one or two transistors for pre-discharging or pre-charging nodes cn and n1. The silicon area of the AND or OR gates of various embodiments is orders of magnitude smaller than traditional AND or OR gates. While FIG. 2A illustrates a 3-input threshold gate, the same concept can be extended to more than 3 inputs to make an N-input threshold gate, where N is greater than 2 and an odd number. The reset mechanism of FIG. 2A is similar to the one described with reference to FIG. 1A.

Figure 2B:
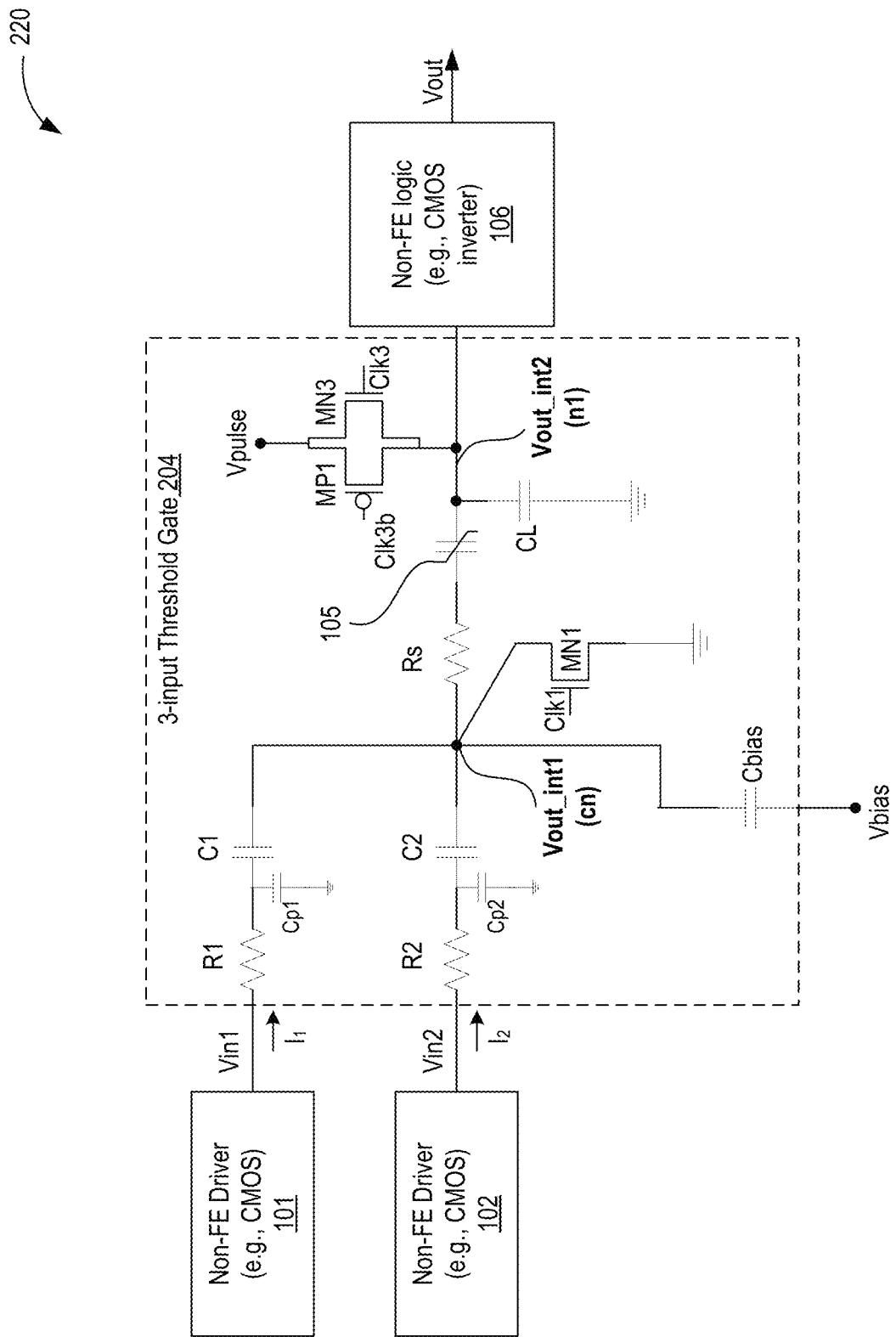
FIG. 2B illustrates a logic gate with a 3-input threshold gate, with pass-gate based reset mechanism, where the 3-input threshold gate can operate as an AND or OR gate, in accordance with some embodiments.

FIG. 2B illustrates logic gate 220 with a 3-input threshold gate, with pass-gate based reset mechanism, where the 3-input threshold gate can operate as an AND or OR gate, in accordance with some embodiments. Logic 220 is similar to logic 200 but for the reset mechanism. The reset mechanism of FIG. 2B is similar to the one described with reference to FIG. 1F.

Figure 2C:
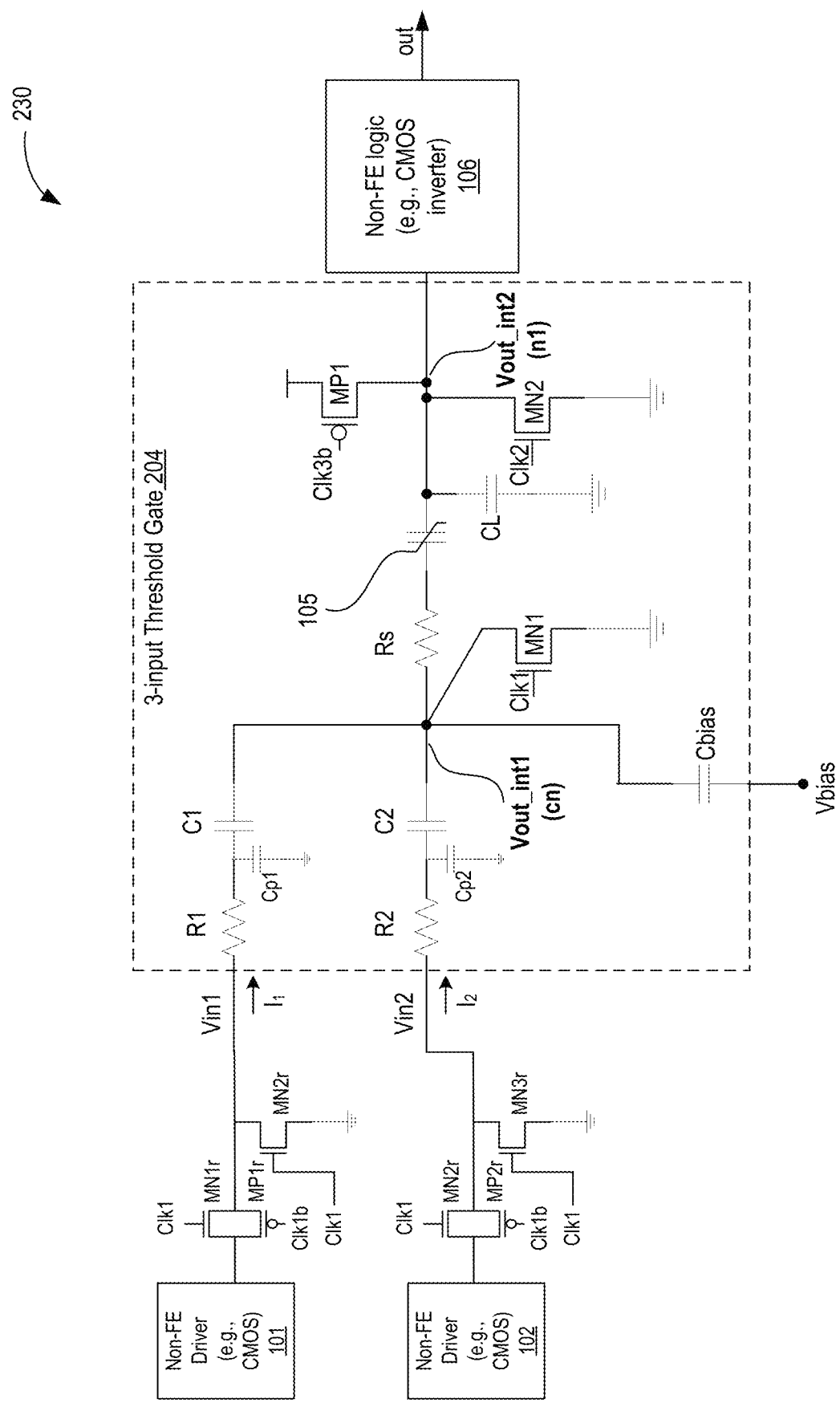
FIG. 2C illustrates a logic gate with a 3-input threshold gate, with input resetting mechanism, where the 3-input threshold gate can operate as an AND or OR gate, in accordance with some embodiments.

FIG. 2C illustrates logic gate 230 with a 3-input threshold gate, with input resetting mechanism, where the 3-input threshold gate can operate as an AND or OR gate, in accordance with some embodiments. Logic 230 is similar to logic 200 but for the reset mechanism. The reset mechanism of FIG. 2C is similar to the one described with reference to FIG. 1H.

Figure 2D:
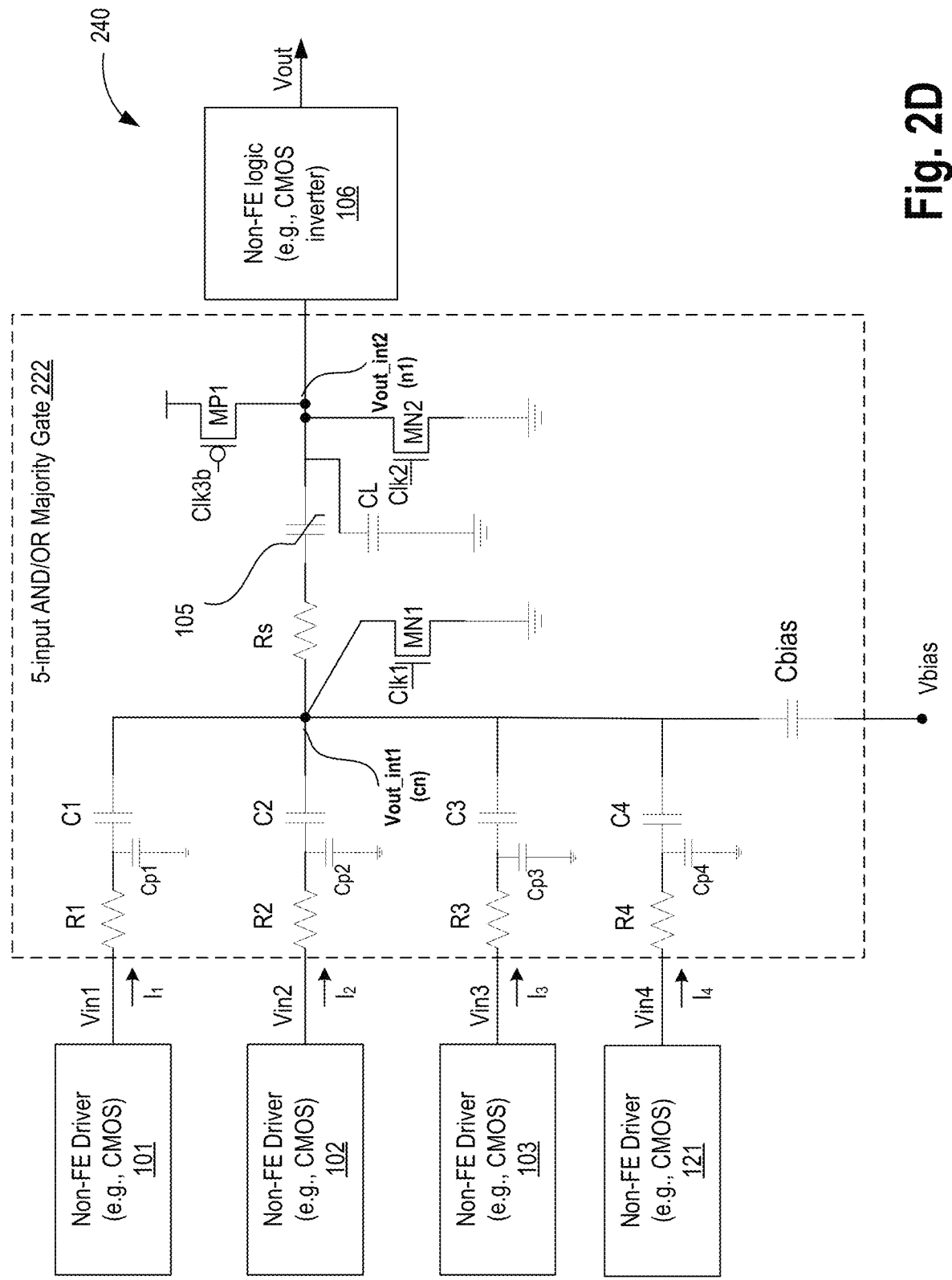
FIG. 2D illustrates a logic gate with a 5-input threshold gate which can operate as an AND or OR gate, in accordance with some embodiments.

FIG. 2D illustrates logic gate 240 with a 5-input AND/OR majority gate 222 which can operate as an AND or OR gate with majority function, in accordance with some embodiments. For purposes of explaining the 5-input AND/OR majority gate 222, consider the capacitances to be Cbias=C3=C4=C/2, C1=C, and C2=C with corresponding input potentials: Vbias=$V_B$, Vin3=$V_A$, Vin4=$V_B$, Vin1=$V_C$, and Vin2=$V_S$, where $V_B$=−$V_o$ is a constant bias voltage and the rest are binary input voltages of +/−$V_o$ for some yet to be determined $V_o$. Gate 222 has a function of (A AND B, C, S). Here, the AND gate function is absorbed into the majority gate at the cost of a bias voltage.

If both $V_S$=$V_C$=+$V_o$, then regardless of $V_A$, $V_B$, it is desired that the output is greater than $V_c$ in magnitude, the coercive voltage. For $V_A$=$V_B$=−$V_o$, the average potential is expressed as:

$$V_F = \frac{C \cdot 2V_o - C/2 \cdot 2V_o - V_o \cdot C/2}{3.5C} \qquad (11)$$

$$V_F = \frac{1}{7}V_o > V_c \cdot 4 \qquad (12)$$

If $V_A$=$V_B$=+$V_o$ and $V_c$=$V_d$=−$V_o$, the following is achieved:

$$V_F = \frac{-C \cdot 2V_o - C/2 \cdot 2V_o - V_o \cdot C/2}{3.5C} \qquad (13)$$

$$V_F = -\frac{1}{7}V_o < -V_c \cdot 4 \qquad (14)$$

To check the equivalence to an AND operation, consider $V_A = -V_B = V_o$, then $$V_F = \frac{V_A + V_B - V_o}{3.5C} \quad (15)$$

$$V_F \in \left\{ -\frac{3}{7}V_o, -\frac{1}{7}V_o, \frac{1}{7}V_o \right\} \quad (16)$$

As designed, merely when $V_A = V_B = +V_o$, gate 222 produces a positive output. It is further observed that all outputs are greater than $V_C$ by setting $V_o > 7V_C$, in accordance with some embodiments.

Here, AND function is performed between Vin3 and Vin4, and the resulting output is used to perform majority function with Vin1 and Vin2, which is described as: Majority (Vin3 AND Vin4, Vin1, Vin2). Table 5 illustrates the truth table of AND majority gate 222. Applying a negative voltage or bias van be akin to applying an input signal logic low as well

TABLE 5

| Vin1 | Vin2 | Vin3 | Vin4 AND Function | Vbias | en Majority of AND(Vin1, Vin2) Vin3, Vin4, Vbias |
|------|------|------|-------------------|-------|--------------------------------------------------|
| 0 | 0 | 0 | 0 | negative | 0 |
| 0 | 0 | 0 | 1 | negative | 0 |
| 0 | 0 | 1 | 0 | negative | 0 |
| 0 | 0 | 1 | 1 | negative | 0 |
| 0 | 1 | 0 | 0 | negative | 0 |
| 0 | 1 | 0 | 1 | negative | 0 |
| 0 | 1 | 1 | 0 | negative | 0 |
| 0 | 1 | 1 | 1 | negative | 1 |
| 1 | 0 | 0 | 0 | negative | 0 |
| 1 | 0 | 0 | 1 | negative | 0 |
| 1 | 0 | 1 | 0 | negative | 0 |
| 1 | 0 | 1 | 1 | negative | 1 |
| 1 | 1 | 0 | 0 | negative | 1 |
| 1 | 1 | 0 | 1 | negative | 1 |
| 1 | 1 | 1 | 0 | negative | 1 |
| 1 | 1 | 1 | 1 | negative | 1 |

In the OR majority function case, OR function is performed between Vin3 and Vin4, and the resulting output is used to perform majority function with Vin1 and Vin2, which is described as: Majority (Vin3 OR Vin4, Vin1, Vin2). Table 6 illustrates the truth table of OR majority gate 222. Applying a positive voltage on Vbias can be akin to applying an input signal logic high as well.

TABLE 6

| Vin1 | Vin2 | Vin3 | Vin4 OR Function | Vbias | en Majority of OR(Vin3, Vin4) Vin3, Vin4, Vbias |
|------|------|------|------------------|-------|-------------------------------------------------|
| 0 | 0 | 0 | 0 | positive | 0 |
| 0 | 0 | 0 | 1 | positive | 0 |
| 0 | 0 | 1 | 0 | positive | 0 |
| 0 | 0 | 1 | 1 | positive | 0 |
| 0 | 1 | 0 | 0 | positive | 0 |
| 0 | 1 | 0 | 1 | positive | 1 |
| 0 | 1 | 1 | 0 | positive | 1 |
| 0 | 1 | 1 | 1 | positive | 1 |
| 1 | 0 | 0 | 0 | positive | 0 |
| 1 | 0 | 0 | 1 | positive | 1 |
| 1 | 0 | 1 | 0 | positive | 1 |
| 1 | 0 | 1 | 1 | positive | 1 |
| 1 | 1 | 0 | 0 | positive | 1 |
| 1 | 1 | 0 | 1 | positive | 1 |
| 1 | 1 | 1 | 0 | positive | 1 |
| 1 | 1 | 1 | 1 | positive | 1 |

Logic gate 222 can perform AND majority and OR majority functions depending on the bias value for Vbias. Here, merely two transistors (MN1 and MN2) that can be condensed to a single transistor for pre-charging or pre-discharging nodes cn and n1, are used while a complex function of AND majority and OR majority are realized.

In various embodiments, majority gate 222 coupled to inverter 106 forms a minority threshold gate (majority-invert threshold), resulting in a universal logic gate.

Figure 3A:
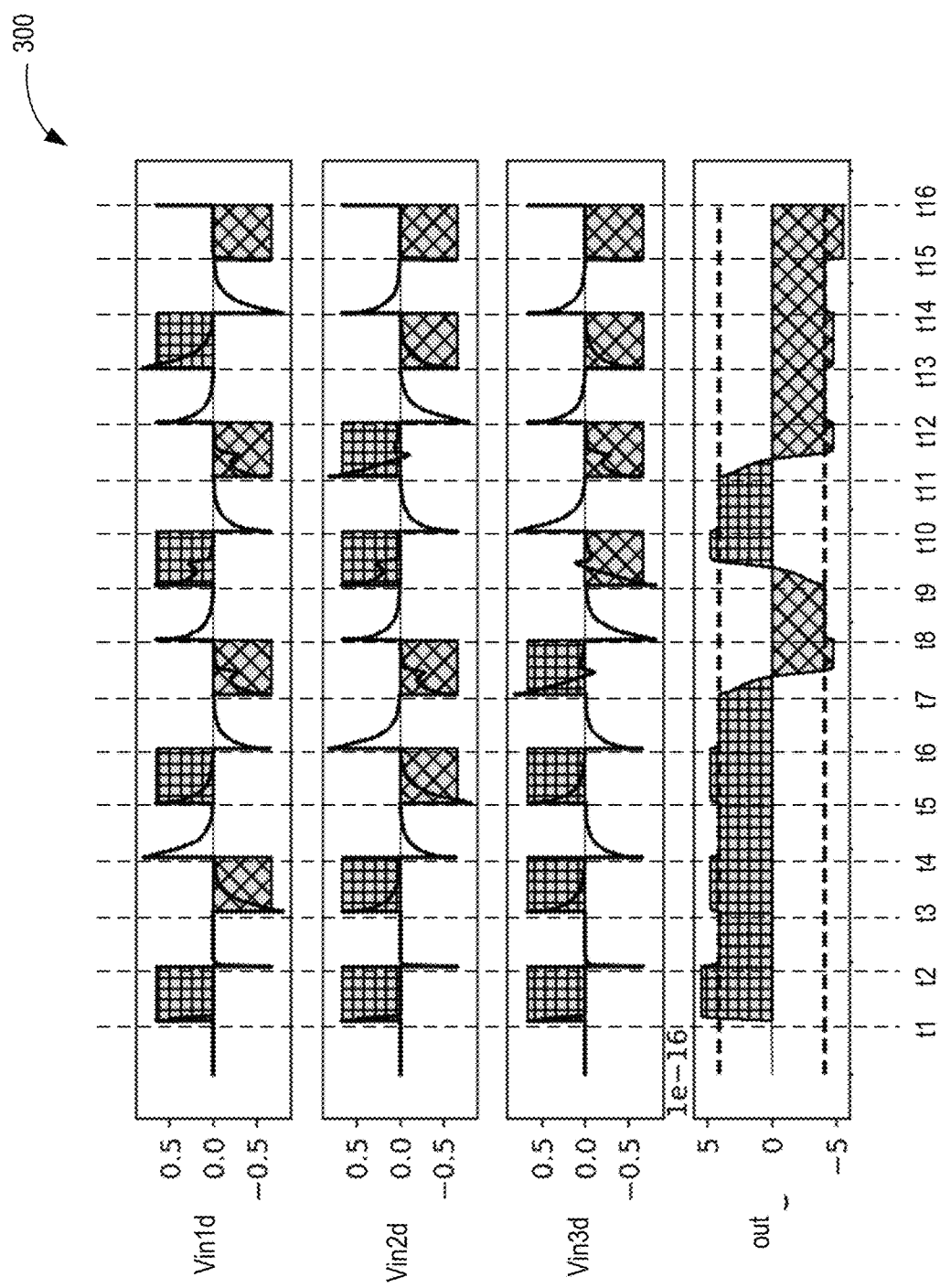
FIG. 3A illustrates waveforms showing operation of 3-input majority gate of FIG. 1B.
Figure 3B:
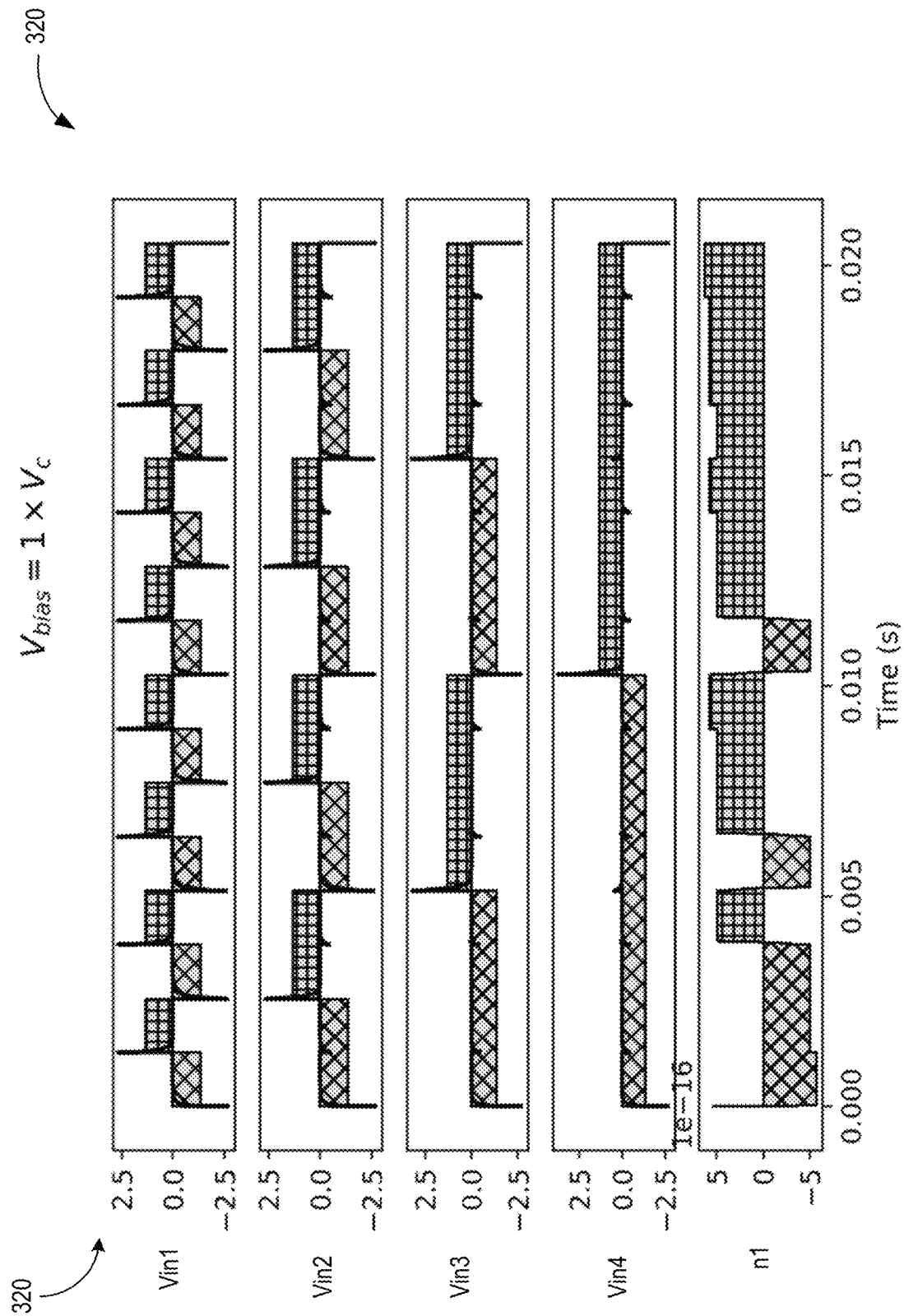
FIGS. 3B-E illustrate waveforms showing operation of 5-input threshold gate with different Vbias values, respectively, in accordance with some embodiments.
Figure 3C:
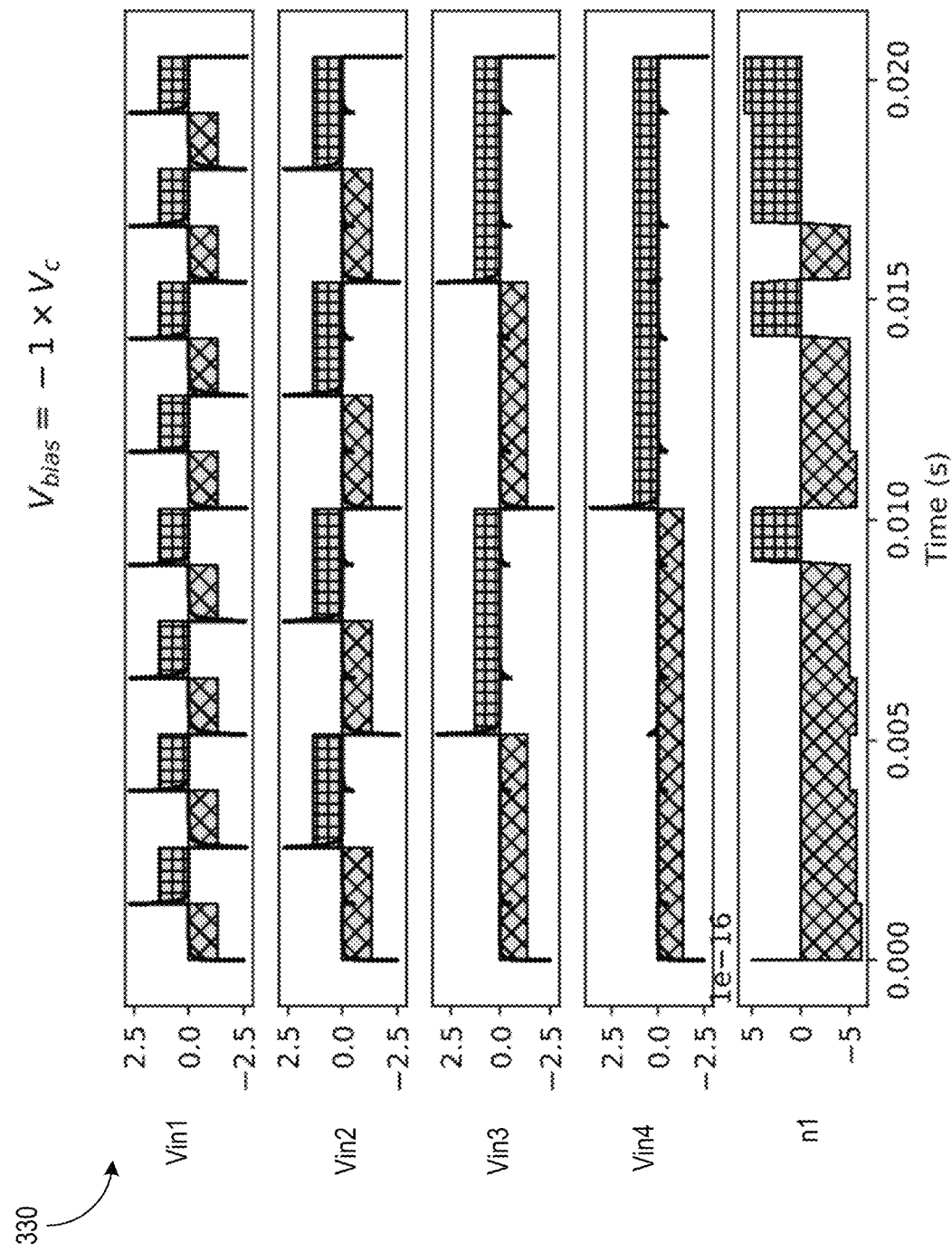
Figure 3D:
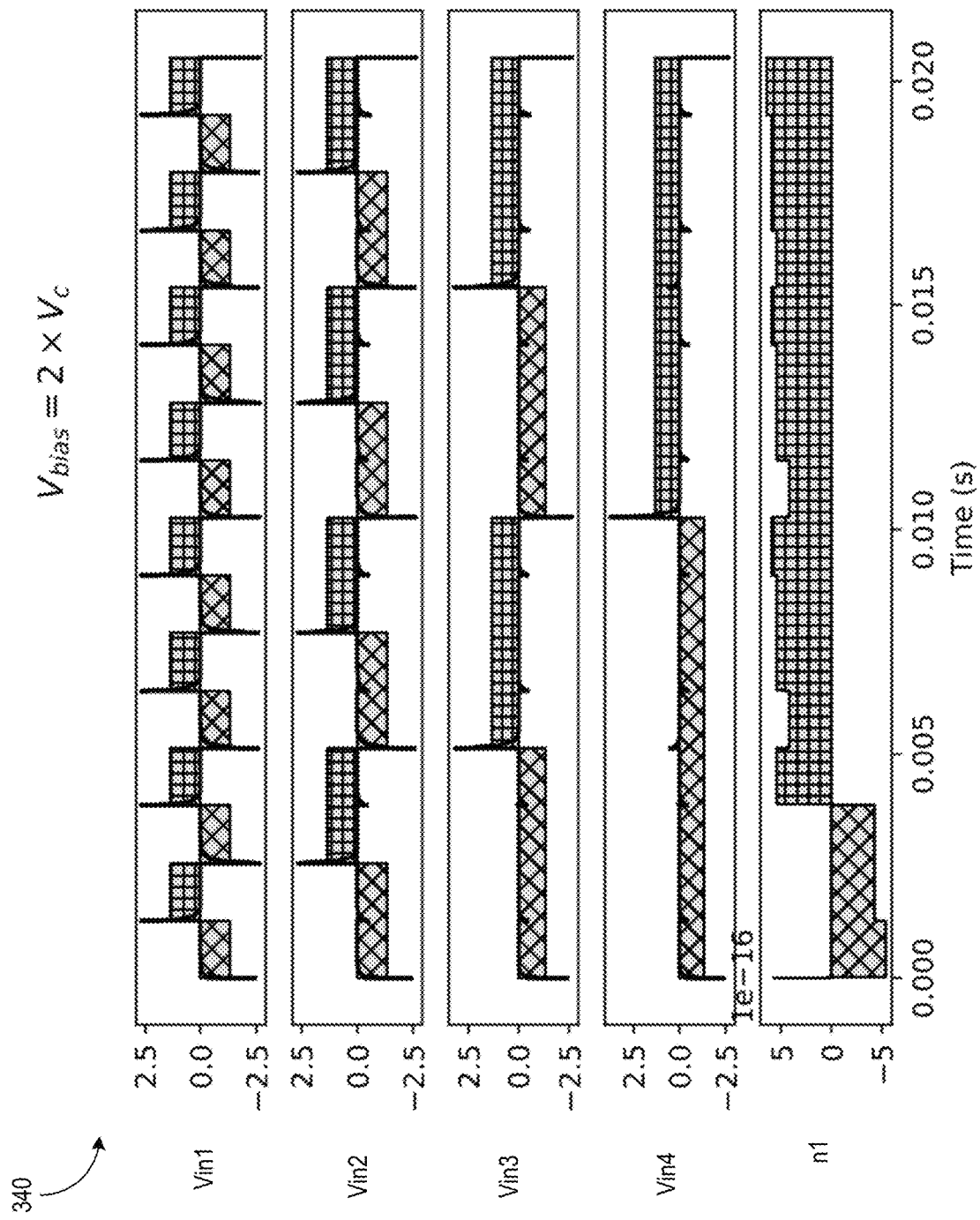
Figure 3E:
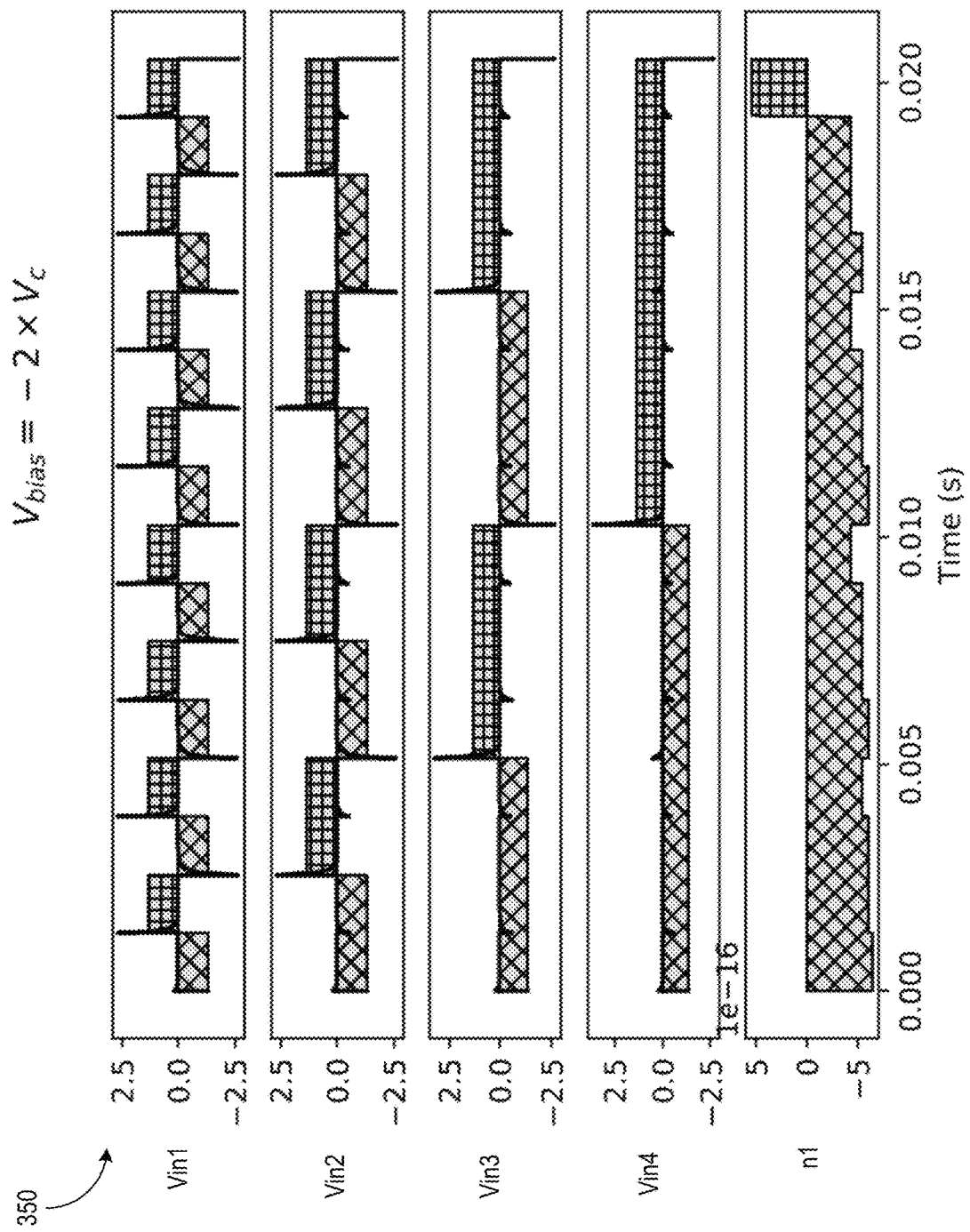

FIG. 3A illustrates waveforms 300 showing operation of 3-input majority gate of FIG. 1B, in accordance with some embodiments. FIG. 3A illustrates a majority function of inputs Vin1, Vin2, and Vin3.

FIGS. 3B-E illustrate waveforms 320, 330, 340, and 350 showing operation of 5-input threshold gate with different Vbias values, respectively, in accordance with some embodiments.

Figure 4:
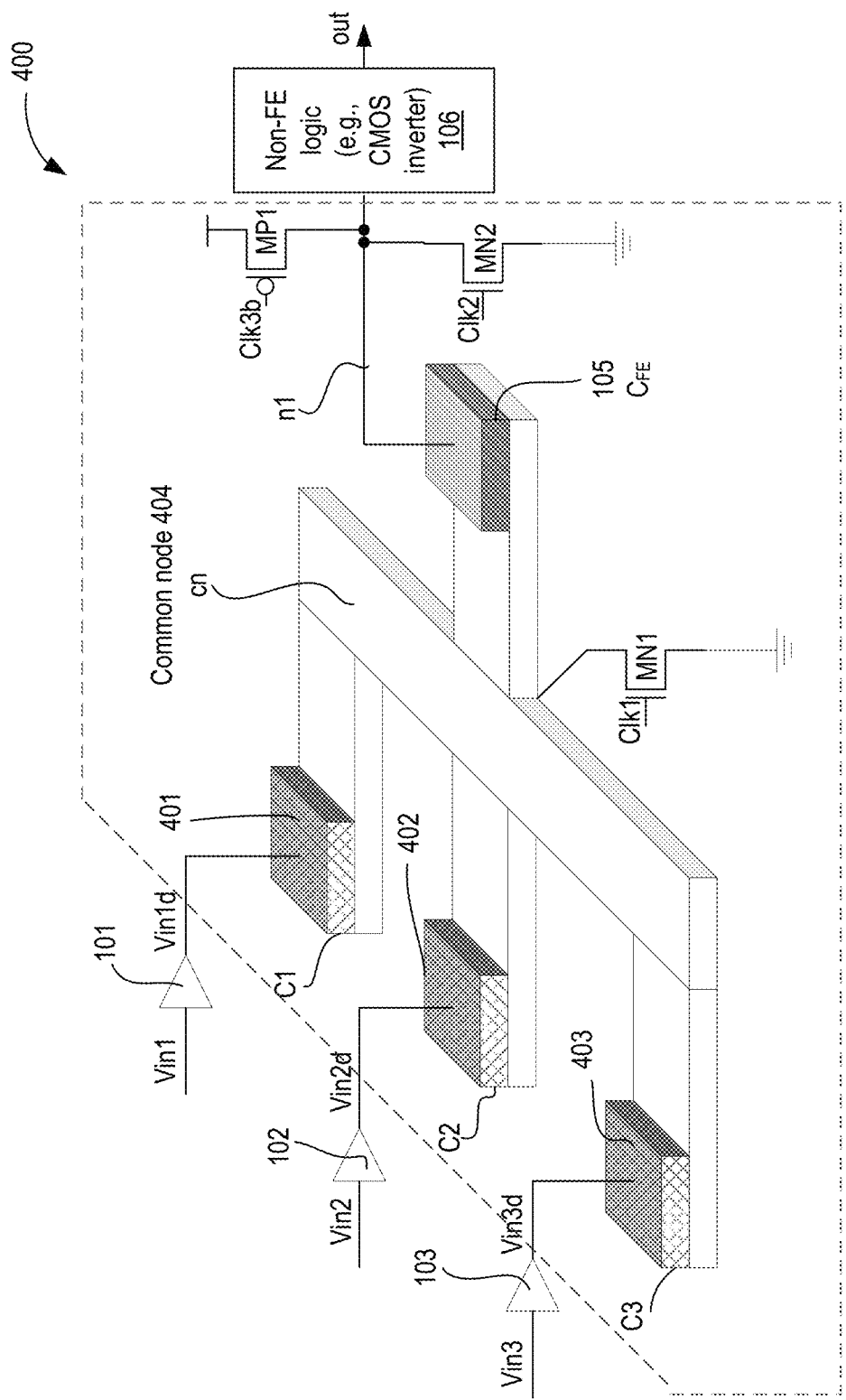
FIG. 4 illustrates combinational logic including the logic gate of FIG. 1A with a 3D (three-dimensional) view of the 3-input majority gate that couples to an inverter or buffer, in accordance with some embodiments.

FIG. 4 illustrates combinational logic 400, including the logic gate of FIG. 1A with a 3D (three-dimensional) view of the 3-input majority gate that couples to an inverter or buffer, in accordance with some embodiments. Any of the reset mechanisms described herein (e.g., with reference to FIGS. 1A-I) are applicable to logic 400.

In this example, capacitors C1 (401), C2 (402), and C3 (403) are MIM capacitors that receive inputs Vin1, Vin2, and Vin3, respectively, on their first terminals from buffers or drivers 101, 102, and 103, respectively. However, other types of capacitors can be used. For example, hybrid of metal and transistor can be used to implement the capacitor. The second terminals of capacitors C1 (401), C2 (402), and C3 (403) are coupled to common node interconnect 404 (Vout_int1). The output of drivers 101, 102, and 103 are Vin1d, Vin2d, and Vin3d, respectively. Interconnect 404 can be on any suitable metal layer. In some embodiments, interconnect 404 comprises a material which includes one or more of: Cu, Al, Ag, Au, Co, or W. In some embodiments, capacitors C1 (401), C2 (402), and C3 (403) are formed in the backend of the die. In some embodiments, capacitors C1 (401), C2 (402), and C3 (403) are formed in the frontend of the die. Interconnect 404 is coupled to a first terminal of non-linear polar capacitor 105. In this example, capacitor 105 comprises ferroelectric material and hence is labeled as $C_{FE}$. However, other non-linear polar material described herein can be used to fabricate capacitor 105. The second terminal of capacitor 105 is coupled to node n1 (Vout_int2).

In some embodiments, capacitor 105 is a pillar capacitor. A pillar capacitor is taller than its width and allows for compact layout in the z-direction. In one embodiment, capacitors C1 (401), C2 (402), and C3 (403) are fabricated below or under pillar capacitor forming a vertical majority gate.

Figure 5:
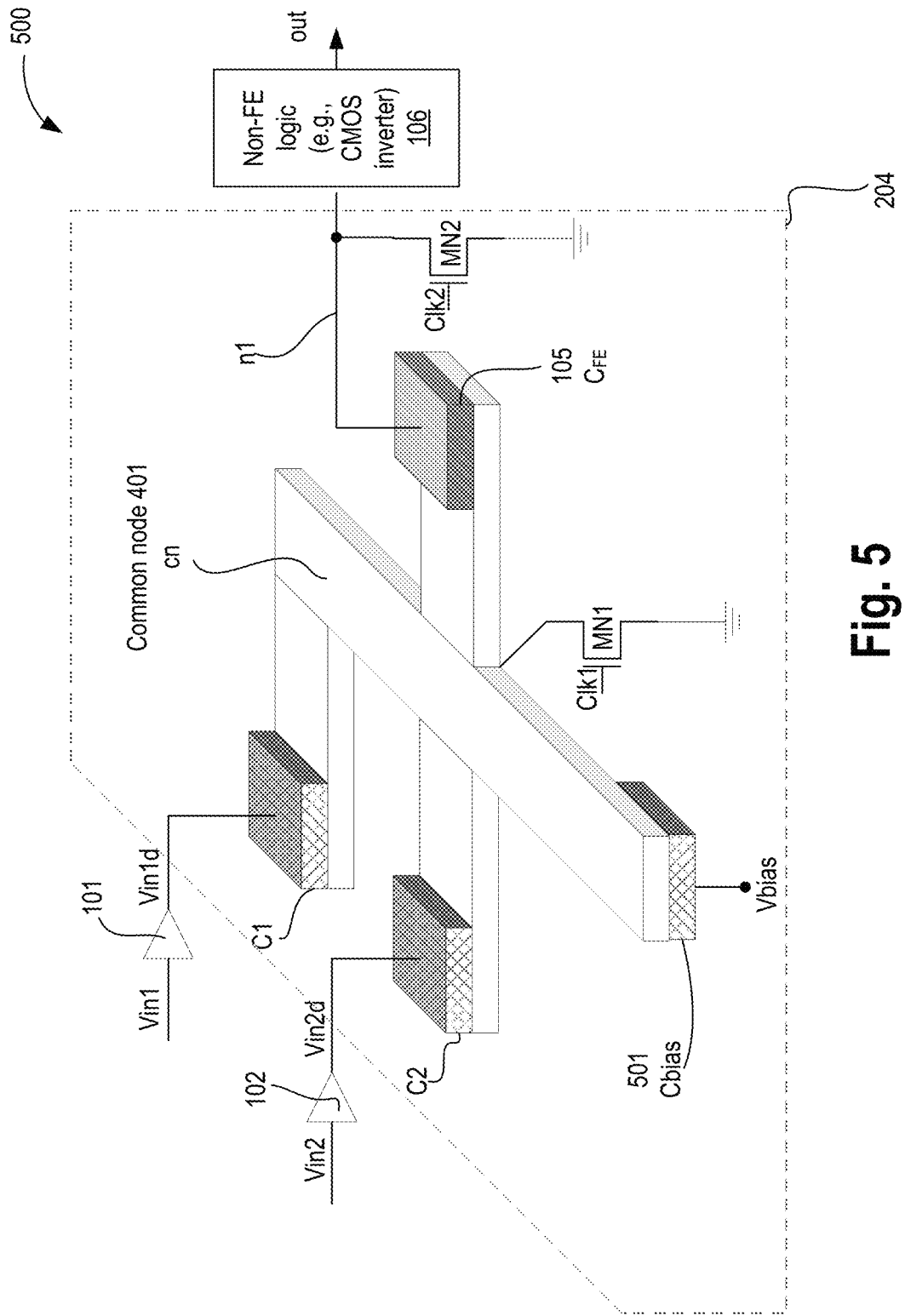
FIG. 5 illustrates combinational logic including the logic gate of FIG. 1B with a 3D view of the 3-input threshold gate that couples to an inverter or buffer, in accordance with some embodiments.

FIG. 5 illustrates combination logic 500 having logic gate of FIG. 1B with a 3D view of the 3-input threshold gate that couples to an inverter or buffer, in accordance with some embodiments. Here, 3-input threshold gate 204 is similar to majority gate of FIG. 4 but for removing capacitor C3 and its associated input and adding an extra capacitor 501 Cbias which is biased by Vbias. Vbias can be positive or negative. The various embodiments described with reference to FIG. 1B and FIG. 4 are applicable here. Any of the reset mechanisms described herein (e.g., with reference to FIGS. 1A-I) are applicable to logic 500.

Figure 6:
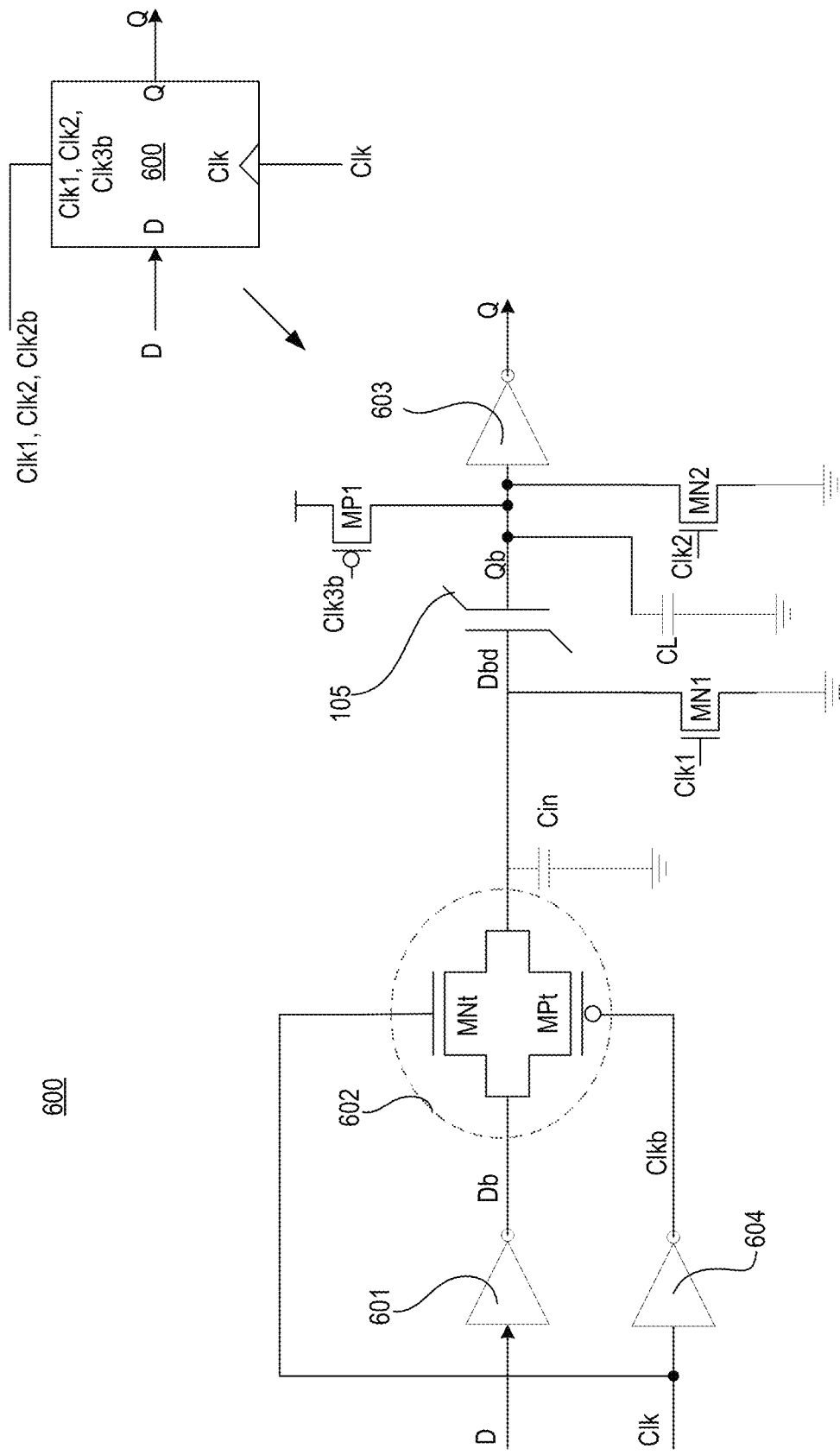
FIG. 6 illustrates a low power sequential circuit (e.g., latch) comprising a non-linear polar capacitor, in accordance with some embodiments.

FIG. 6 illustrates a low power sequential circuit 600 (e.g., latch) comprising a non-linear polar capacitor, in accordance with some embodiments. In some embodiments, sequential circuit 600 includes data input (D), clock input (Clk), reset clock inputs (Clk1, C11(2, Clk3b), and output (Q). In some embodiments, sequential circuit 600 includes load capacitor CL. Sequential circuit 600 comprises inverters 601, pass-gate 602, inverter 603, inverter 604, non-linear polar capacitor 105, and transistors MN1 and MN2. Pass-gate 602 comprises n-type transistor MNt and p-type transistor MPt. Transistor MNt is controlled by Clk while transistor MPt is controlled by Clkb (which is an inverse of Clk). Here, node names and signal names are interchangeably used. For example, Clk may refer to clock signal or clock node carrying the clock signal depending on the context of the sentence.

In some embodiments, pass-gate 602 is replaced with a tri-statable inverter or buffer. The data input D is inverted by inverter 601. In some embodiments, inverters 601 and 603 are replaced with a buffer. Pass-gate 602 is also coupled to non-linear polar capacitor 105. For example, the first terminal Dbd is coupled to pass-gate 602 or a tristate inverter (not shown) while the second terminal Qb is coupled to an input of inverter 603. The output of inverter 603 is Q. In some embodiments, non-linear polar capacitor 105 is implemented as two or more parallel non-linear polar capacitors. In some embodiments, non-linear polar capacitor 105 is implemented as two or more non-linear polar capacitors in series. In some embodiments, an input capacitor Cin is coupled to node Dbd. The value of capacitance of capacitor Cin depends on the parasitic capacitance on node Dbd and the desired speed or timing of latch 600.

In various embodiments, node Qb is a floating node, which can be grounded between logic operations by transistor MN2 to remove any charge buildup. Like transistor MN1, in some embodiments, transistor MN1 is also used to discharge node Dbd. Nodes Dbd (same as Vout_in1) and Qb (same as Vout_int2) are reset according to the schemes described with reference to FIGS. 1A-I using transistors MN1, MN2, and MP1. After reset phase, latch 600 can perform its normal operation.

Unlike traditional CMOS, transistors of inverter 603 are not connected to Source or Drain terminals when Clk=0. In various embodiments, non-linear polar capacitor 105 is a ferroelectric capacitor. However, as mentioned here, it can also be para-electric capacitor or non-linear dielectric capacitor. In sequential circuit 600, ferroelectric capacitor 105 retains charge, which is able to power the gates of transistors of inverter 603. For example, the charge (depending on its polarity) on ferroelectric capacitor 105 can turn off/on the p-type/n-type transistors of inverter 603.

When clock Clk is 1 (e.g., logical high value) the inverted input Dbd is allowed to flow to ferroelectric capacitor 105 via pass-gate 602, overriding the previously held charge on node Dbd and setting the ferroelectric charge to the inverse of the input D. The charge on capacitor 105 (e.g., on node Qb) is sent directly to the inverter 603. In this case, the output Q is equal to the input D.

When clock Clk is 0 (e.g., logical low value) and the previous input D is also 0, no voltage can pass through to ferroelectric capacitor 105 because pass-gate 602 is open. However, ferroelectric capacitor 105 retains the charge of 1 from the previous input of 0. This charge of 1 is inverted so that the output Q stays 0, despite any changes to the input D. As such, a sequential circuit (e.g., latch) behavior is realized by merely a few transistors and a ferroelectric capacitor.

Similarly, if clock Clk is 0 and the previous input D was 1, the ferroelectric capacitor 105 retains a charge of 0 on node Qb and the output Q stays 1 regardless of the logical state of the current input D. In some embodiments, the inverters 601, 602, and/or 603 can be replaced with NAND or NOR gates. These NAND or NOR gates can be implemented using the threshold majority gates (AND and OR gates followed by an inverter driver). As such, clock gating, scan data input multiplexing, gating based on other signals, and set features can be realized. In various embodiments, the non-linear polar capacitor 105 is formed or positioned in the backend of the die while other active devices of gates 601, 602, 603, 604, and/or transistors MN1, MN2, and MP1 can be formed in the frontend of die (e.g., in CMOS process technology) or backend of the die (e.g., in thin film transistor (TFT) process technology).

FIG. 7 illustrates table 700 showing truth table of the low power sequential circuit of FIG. 6, in accordance with some embodiments. Table 700 illustrates three operational modes—transparent, storage, and reset. During transparent mode, Clk is 1 and D passes to output Q. During storage mode, Clk is 0, and output Q stores the previous value i.e., Qn−1. During reset mode, Clk is 1 while Clk1 is one too. In some embodiments, during reset phase, Clk and D are conditioned to be 1.

Figure 8A:
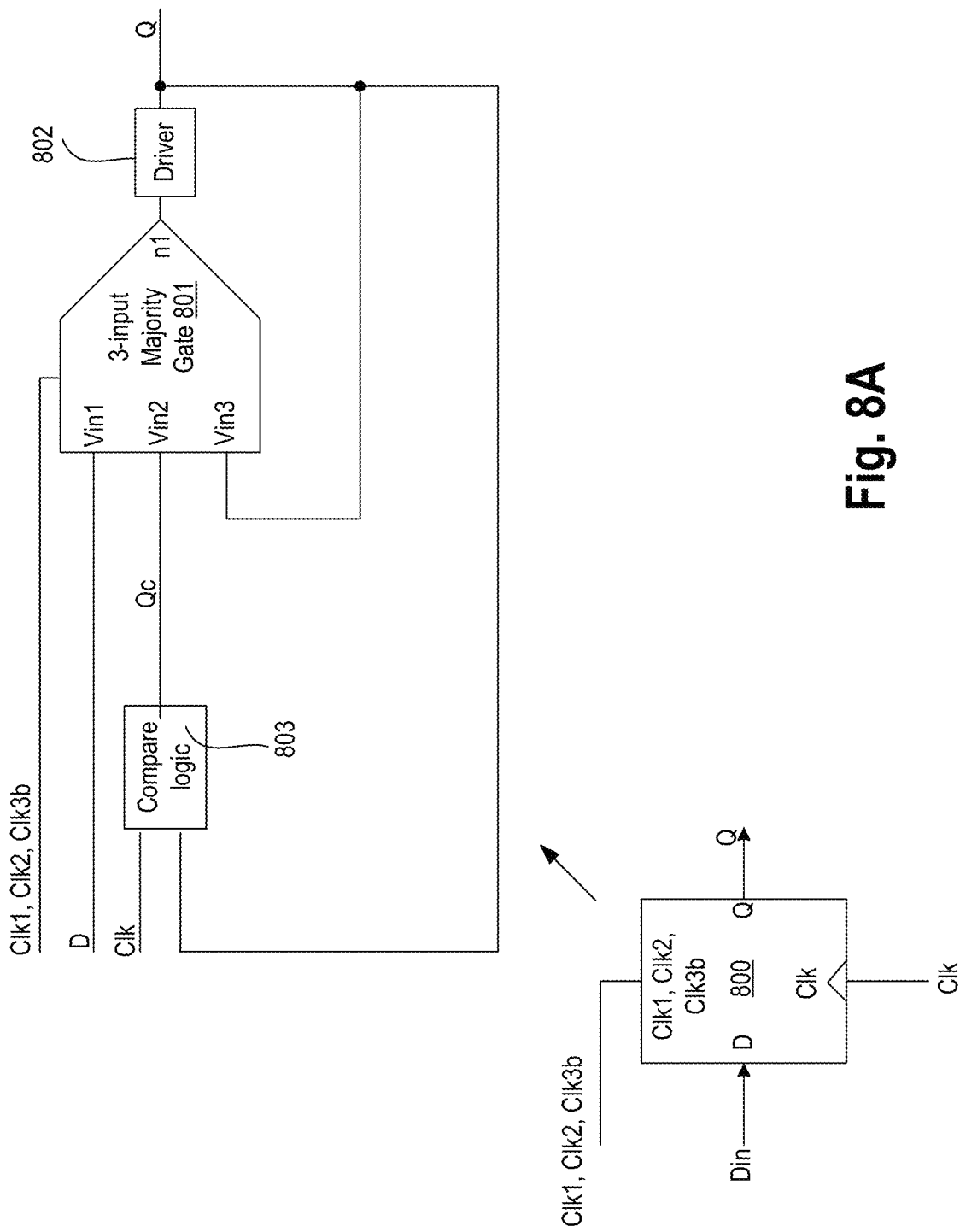
FIG. 8A illustrates a low power majority gate based sequential circuit (e.g., latch) comprising a non-linear polar capacitor, in accordance with some embodiments.

FIG. 8A illustrates a low power majority gate based sequential circuit 800 (e.g., latch) comprising a non-linear polar capacitor, in accordance with some embodiments. Sequential circuit 800 includes data input (D), clock input (Clk), reset clock input (Clk1, Clk2, Clk3b), and output (Q). In some embodiments, sequential circuit 800 comprises a 3-input Majority Gate 801, driver 802, and compare logic 803.

3-input Majority Gate 801 receives data input D at its input node Vin, output Qc of compare logic 803 at its input Vin2, and output Q at its input Vin3. In some embodiments, 3-input Majority Gate 801 is same as gate 104 of FIG. 1A and FIG. 4. 3-input Majority Gate 801 performs a majority function on input data D, output Qc of compare logic 803, and output Q. The result of the majority function is accumulated on node cn (common node) which is then stored on non-linear polar capacitor 105. The other terminal of non-linear polar capacitor 105 is node n1. The voltage on node n1 is driven output by driver 802 to output node Q. Driver 802 can be any suitable driver. For example, driver 802 is one of: a buffer, AND gate, OR gate, amplifier, etc. In some embodiments, the pre-discharge transistors MN1 and MN2 (or their p-type equivalents to pre-charge nodes cn and/or n1) are controlled by reset Rst signals.

In some embodiments, compare logic 803 compares the logic values of clock Clk and output Q and generates a logic 1 value for output Qc when either Clk or Q is of logic 1 value. When clock clk and output Q have the same logic levels, then compare logic 803 generates a logic 0 value on node Qc. In various embodiments, compare logic 803 is an exclusive-OR (XOR) gate. In some embodiments, compare logic 803 is an X-NOR. In other embodiments, other logic gates can be used that perform the function discussed herein. While the embodiments here are described with reference to a 3-input majority gate, it can also be implemented with a threshold gate as discussed with reference to FIG. 1B.

Figure 8B:
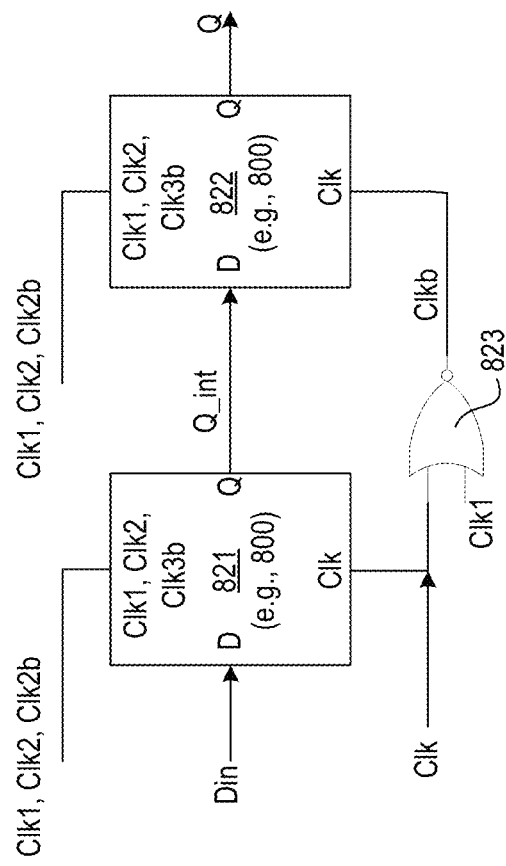
FIG. 8B illustrates a low power majority-gate based flip-flop circuit comprising a non-linear polar capacitor, in accordance with some embodiments.

FIG. 8B illustrates a low power majority-gate based flip-flop circuit 820 comprising a non-linear polar capacitor, in accordance with some embodiments. In some embodiments, a flip-flop can be realized by serial combination of two latches 800. Here, the first latch 821 is an instance of latch 800, and second latch 822 is another instance of latch 800. The output Q (labeled Q_int) of latch 821 is received as input D of latch 822. Latch 821 behaves as the master latch while latch 822 behaves as the slave latch. In various embodiments, clock Clk is provided to the clock input Clk of latch 821 while an inverted version Clkb of it is provided to the clock input Clk of latch 822. In some embodiments, a NOR gate 823 is provide to generate the inverted version of Clkb by performing a NOR operation of Clk and Clk1. In some embodiments, during the reset phase (e.g., when Clk1=1), Din and Clk are conditioned to zero to reset the non-linear polar capacitors of latches 821 and 822.

Figure 9:
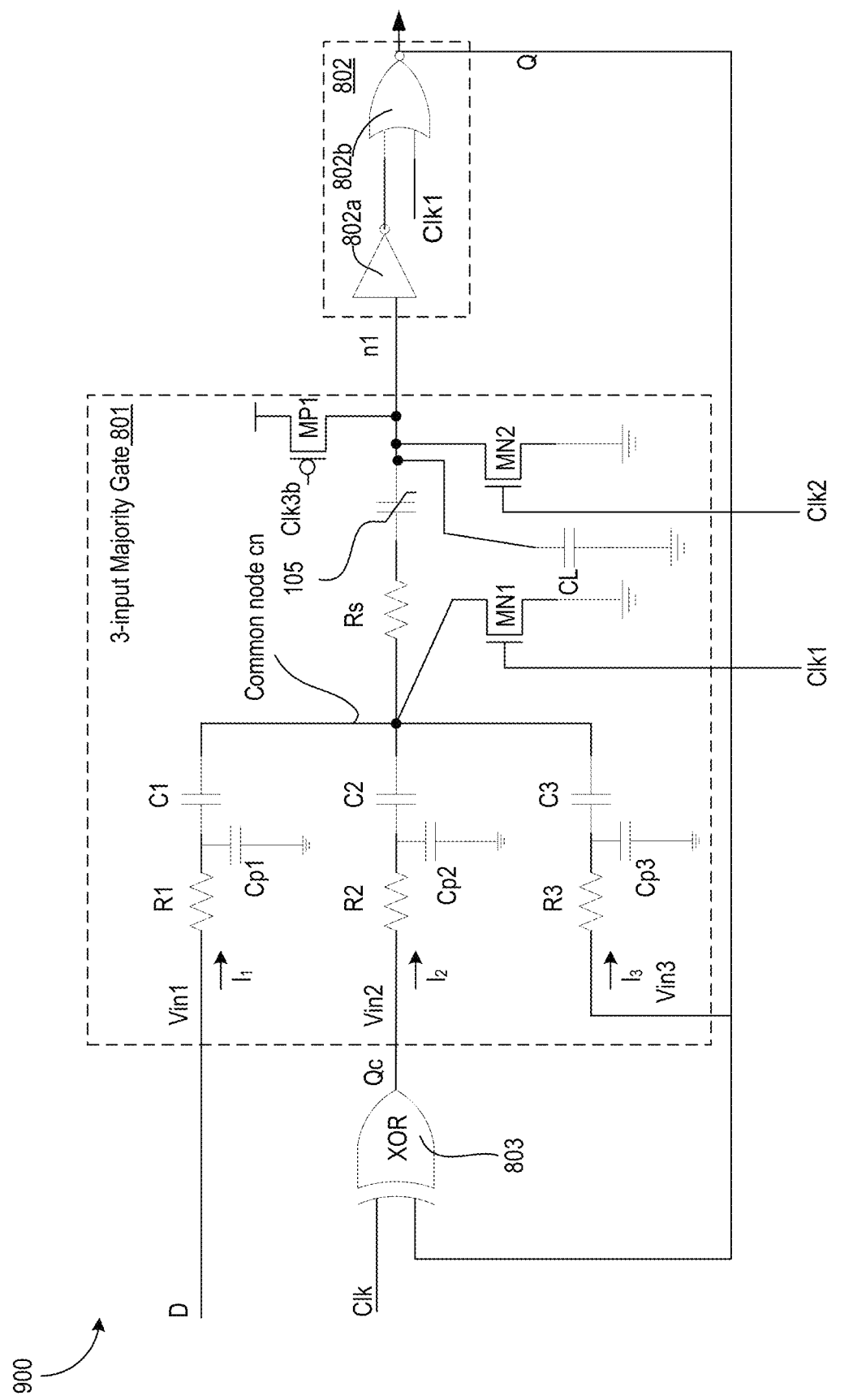
FIG. 9 illustrates a schematic of sequential circuit of FIG. 8A, in accordance with some embodiments.

FIG. 9 illustrates schematic 900 of sequential circuit 800 of FIG. 8A, in accordance with some embodiments. Here, 3-input majority gate 801 is illustrated, which is same as majority gate 104 but for Rst signals to control pre-discharge transistors MN1 and MN2. In this example, compare logic 803 is illustrates as XOR 803. Circuit 800 utilizes a ferroelectric majority gate 801 and an XOR gate 803 to create another D-flip-flop. Because the majority gate uses a buffer and the output Q is directly connected to source or drain of the transistors of the buffer and not the ferroelectric, the output Q can be safely fed back into gate 801 via input Vin3 of gate 801.

The function of circuit 800 is expressed as:

$$Q=\text{majority}(D,Q_{prev},\text{XOR}(Q_{prev},\text{Clk})) \quad (17)$$

Where, $Q_{prev}$ is the previous output state of Q.

After the clock signal clk is set to 1, the previous output Q is still being fed back into the circuit 801, before it updates Qc. Because of the clock input of 1, Qc and Vin3 (or Q) are always opposites, regardless of what the previous Q value is. This function is expressed:

$$Q=\text{majority }(D,Q_{prev},\text{XOR}(Q_{prev},1)) \quad (18)$$

$$=\text{majority }(D,Q_{prev},\overline{Q_{prev}})=D \quad (19)$$

In the case where the input D=1 and the previous output Q=1, majority gate 801 has inputs (Vin1=1, Vin2=0, Vin3=1) which averages to an output of 1 on common node cn. This output 1 propagates through capacitor 105 to output Q.

In the case where the input D=1 and the previous output Q=0, majority gate 801 has inputs (Vin1=1, Vin2=1, Vin3=0) which averages to an output of 1 on common node cn. This new output propagates through capacitor 105 to output Q.

In the case where the input D=0 and the previous output Q=0, majority gate 801 has inputs (Vin1=0, Vin2=1, Vin3=0) which averages to an output of 0 on common node cn. In the case where the input D=0 and the previous output Q=1, majority gate 801 has inputs (Vin1=0, Vin2=0, Vin3=1) which averages to an output of 0 on common node cn. This new output propagates through capacitor 105 to output Q.

By contrast, when the clock Clk is 0, Qc and Vin3 (or Q) are always equal to the previous output Q. Because Qc and Vin3 form the majority of majority gate 801, the output of the majority gate 801 is always equal to the previous output, regardless of input D. This function is expressed as:

$$Q=\text{majority }(D,Q_{prev},\text{XOR}(Q_{prev},0)) \quad (20)$$

$$=\text{majority }(D,Q_{prev},Q_{prev})=Q_{prev} \quad (21)$$

Table 7 provides the truth table of the operation of latch 900.

TABLE 7

| Operation Mode | Clk | Qn-1 | D | Vin1 | Vin2 | Vin3 | Vn1 | Qn |
|---|---|---|---|---|---|---|---|---|
| Transparent | 1 | 0 | Din | Din | 1 | 0 | Din | Din |
| Transparent | 1 | 1 | Din | Din | 0 | 1 | Din | Din |
| Storage | 0 | 0 | Din | Din | 0 | 0 | 0 | 0 |
| Storage | 0 | 1 | Din | Din | 1 | 1 | 1 | 1 |
| Reset | 0 | 0 | 0 | 0 | 0 | 0 | 0→1→0 | 0 |

When Clk is 1, data D decides the output value, irrespective of prior state. When Clk is 0, Qn-1 is what goes back to Qn, so latch 900 is in storage mode. During Reset, Clk, D, and Qn are conditioned to be 0 for correct operation. As mentioned, the conditioning can be done by ensuring the circuit that drive Clk and D force a 0 during reset phase. The conditioning can also happen by breaking the path and putting a pull down reset logic. In some embodiments, for the feedback path, during reset phase (Clk1 is high) to cause Qn to be 0 to ensure correct functionality. Causing Qn to be zero can be done splitting the buffer at the output into inverter 802a and NOR gate 802a, where the NOR gate's other input is Clk1. Note: Qn, and Qn-1 are just different states of node Q. Qn-1, just before the inputs transition are applied, and Qn is the present state.

Figure 10:
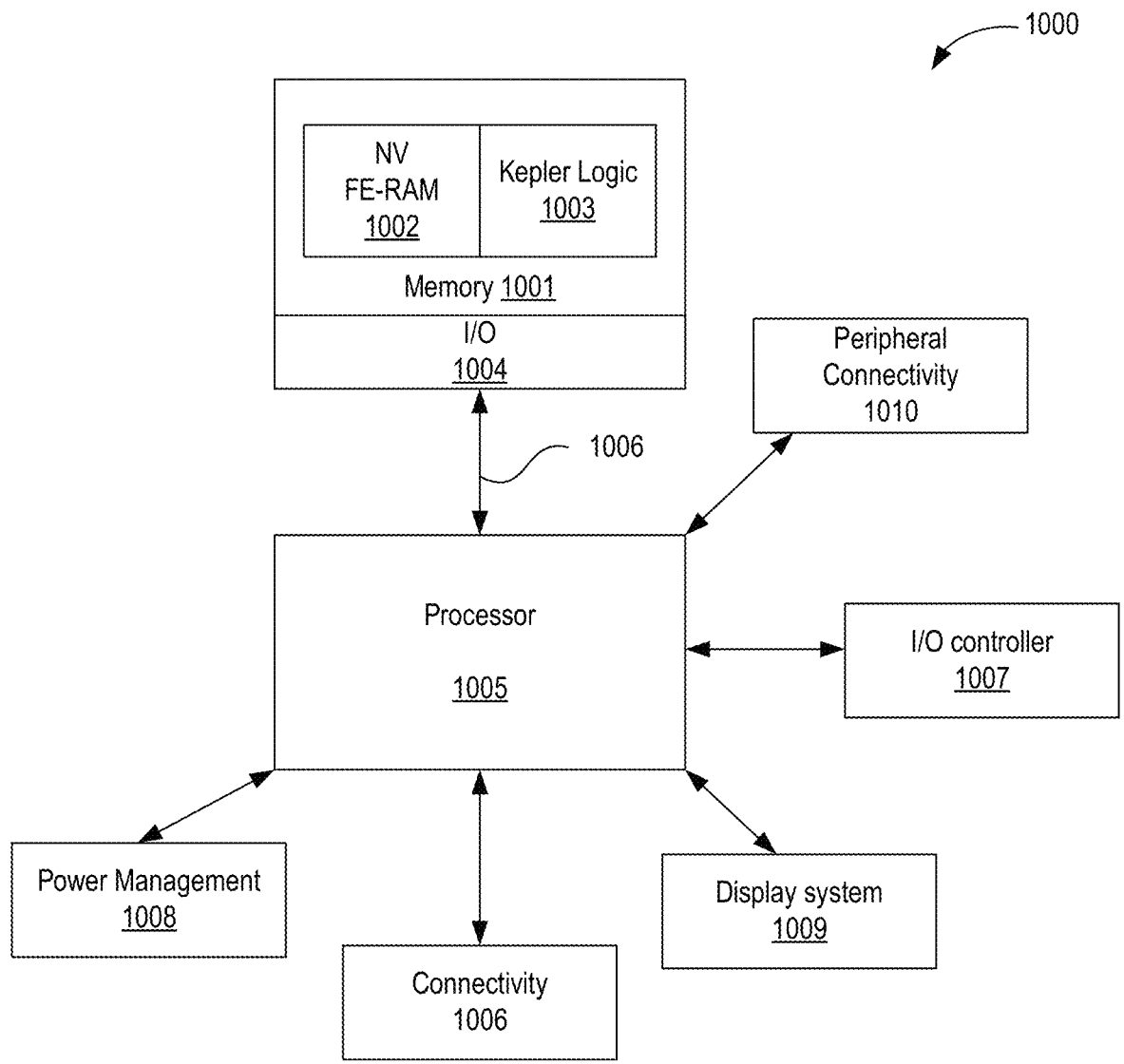
FIG. 10 illustrates a system-on-chip (SOC) that uses the low voltage sequential circuit, in accordance with some embodiments.

FIG. 10 illustrates a system-on-chip (SOC) that uses the low voltage sequential circuit (e.g., 600, 800, 820), in accordance with some embodiments. SOC 1000 comprises memory 1001 having static random-access memory (SRAM) or FE based random access memory FE-RAM, or any other suitable memory. The memory can be non-volatile (NV) or volatile memory. Memory 1001 may also comprise logic 1003 to control memory 1002. For example, write and read drivers are part of logic 1003. These drivers and other logic are implemented using the majority or threshold gates of various embodiments. The logic can comprise majority or threshold gates and traditional logic (e.g., CMOS based NAND, NOR etc.).

SOC further comprises a memory I/O (input-output) interface 1004. The interface may be double-data rate (DDR) compliant interface or any other suitable interface to communicate with a processor. Processor 1005 of SOC 1000 can be a single core or multiple core processor. Processor 1005 can be a general-purpose processor (CPU), a digital signal processor (DSP), or an Application Specific Integrated Circuit (ASIC) processor. In some embodiments, processor 1005 is an artificial intelligence (AI) processor (e.g., a dedicated AI processor, a graphics processor configured as an AI processor).

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, AI processor 405 has reduced latency of computing the training model and using the training model, which reduces the power consumption of such AI processor systems.

Processor 1005 may be coupled to a number of other chip-lets that can be on the same die as SOC 1000 or on separate dies. These chip-lets include connectivity circuitry 1006, I/O controller 1007, power management 1008, and display system 1009, and peripheral connectivity 1100.

Connectivity 1006 represents hardware devices and software components for communicating with other devices. Connectivity 1006 may support various connectivity circuitries and standards. For example, connectivity 1006 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 1006 may support non-cellular standards such as WiFi.

I/O controller 1007 represents hardware devices and software components related to interaction with a user. I/O controller 1007 is operable to manage hardware that is part of an audio subsystem and/or display subsystem. For example, input through a microphone or other audio device can provide input or commands for one or more applications or functions of SOC 1000. In some embodiments, I/O controller 1007 illustrates a connection point for additional devices that connect to SOC 1000 through which a user might interact with the system. For example, devices that can be attached to the SOC 1000 might include microphone devices, speaker or stereo systems, video systems or other display devices, keyboard or keypad devices, or other I/O devices for use with specific applications such as card readers or other devices.

Power management 1008 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 1008 may accordingly put such logic into low power state without the worry of losing data. Power management may select a power state according to Advanced Configuration and Power Interface (ACPI) specification for one or all components of SOC 1000.

Display system 1009 represents hardware (e.g., display devices) and software (e.g., drivers) components that provide a visual and/or tactile display for a user to interact with the processor 1005. In some embodiments, display system 1009 includes a touch screen (or touch pad) device that provides both output and input to a user. Display system 1009 may include a display interface, which includes the particular screen or hardware device used to provide a display to a user. In some embodiments, the display interface includes logic separate from processor 1105 to perform at least some processing related to the display.

Peripheral connectivity 1010 may represent hardware devices and/or software devices for connecting to peripheral devices such as printers, chargers, cameras, etc. Peripheral connectivity 1010 say support communication protocols, e.g., PCIe (Peripheral Component Interconnect Express), USB (Universal Serial Bus), Thunderbolt, High Definition Multimedia Interface (HDMI), Firewire, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention.

Example 1: An apparatus comprising: a 3-input majority logic gate comprising: first, second, and third non-ferroelectric capacitors to receive a first input, a second input, and a third input, respectively; and a non-linear polar capacitor to store a majority function output of the first, second, and third inputs, wherein one terminal of the non-linear polar capacitor provides an output of the 3-input majority logic gate; a driver coupled to the output of the 3-input majority logic gate, wherein the driver is to generate an amplified output of the 3-input majority logic gate, wherein the amplified output is coupled to the third input; and a compare logic to receive an input clock and the amplified output, wherein an output of the compare logic gate is the second input.

Example 2: The apparatus of example 1, wherein the first input is a data input.

Example 3: The apparatus of example 1, wherein the driver comprises one of: a buffer, an amplifier, NAND, AND, OR, multiplexer, or NOR logic gates, wherein the compare logic comprises an exclusive-OR (XOR) gate.

Example 4: The apparatus of example 1, comprising: a first transistor coupled to a first terminal of the non-linear polar capacitor, wherein the first transistor is controllable by a first clock; a second transistor coupled to a second terminal of the non-linear polar capacitor, wherein the second transistor is controllable by a second clock; and a third transistor coupled to the second terminal of the non-linear polar capacitor, wherein the third transistor is controllable by a third clock.

Example 5: The apparatus of example 4, wherein the first clock has a pulse width greater than a pulse width of the second clock and a pulse width of the third clock.

Example 6: The apparatus of example 4, wherein the third clock de-asserts prior to an assertion of the second clock.

Example 7: The apparatus of example 4, wherein the first transistor is a first n-type transistor, wherein the second transistor is a second n-type transistor, and wherein the third transistor is a p-type transistor.

Example 8: The apparatus of example 4, wherein the first transistor, the second transistor, and the third transistor are disabled in an evaluation phase, and enabled in a reset phase, wherein the reset phase is prior to the evaluation phase.

Example 9: The apparatus of example 4, wherein the first and second clocks are same, and wherein the first and second clocks are reset signals.

Example 10: The apparatus of example 4, wherein the first and second clocks are different signals.

Example 11: The apparatus of example 1 comprises: a first driver to generate the first input; and a second driver to generate the input clock.

Example 12: The apparatus of example 11, wherein the first and second drivers comprise CMOS transistors.

Example 13: The apparatus of example 1, wherein the first, second, and third non-ferroelectric capacitors of the 3-input majority logic gate comprise one of: metal-insulator-metal (MIM) capacitor, transistor gate capacitor, hybrid of metal and transistor capacitor; or capacitor comprising para-electric material.

Example 14: The apparatus of example 1, wherein the non-linear polar capacitor includes one of: ferroelectric material, para-electric material, or non-linear dielectric material.

Example 15: The apparatus of example 14, wherein the ferroelectric material includes one of: Bismuth ferrite (BFO), BFO with a doping material where in the doping material is one of Lanthanum, or elements from lanthanide series of the periodic table; Lead zirconium titanate (PZT), or PZT with a doping material, wherein the doping material is one of La or Nb; a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite ferroelectrics includes one of: BaTiO3, PbTiO3, KNbO3, or NaTaO3; hexagonal ferroelectric includes one of: YMnO3 or LuFeO3; hexagonal ferroelectrics of a type h-RMnO3, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides of a form, Hf1−x Ex Oy where E can be Al, Ca, Ce, Dy, er, Gd, Ge, La, Sc, Si, Sr, Sn, or Y; Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 16: The apparatus of example 1, wherein the non-linear polar capacitor is positioned in a backend of a die, while transistors of the driver and the compare logic are positioned in a frontend of a die.

Example 17: An apparatus comprising: a 3-input majority gate having first, second, and third inputs, and a first output; a driver coupled to the first output, wherein the driver is to generate a second output; and a compare logic to receive a clock and the second output, wherein the compare logic is to generate a third output which is coupled to the second input, wherein the first input is to receive a data, and wherein the third input is to receive the second output.

Example 18: The apparatus of example 17, wherein the 3-input majority gate comprises: first, second, and third non-ferroelectric capacitors coupled to the first input, the second input, and the third input, respectively; and a non-linear polar capacitor to store a majority function output of the first, second, and third inputs, wherein one terminal of the non-linear polar capacitor provides the first output.

Example 19: The apparatus of example 17, wherein the driver comprises one of: a buffer, amplifier, NAND, AND, OR, multiplexer, or NOR logic gates, wherein the compare logic comprises an exclusive-OR (XOR) gate.

Example 20: The apparatus of example 18, comprising: a first transistor coupled to a first terminal of the non-linear polar capacitor, wherein the first transistor is controllable by a first signal; a second transistor coupled to a second terminal of non-linear polar capacitor, wherein the second transistor is controllable by a second signal; and a third transistor coupled to the second terminal of the non-linear polar capacitor, wherein the third transistor is controllable by a third signal.

Example 21: The apparatus of example 20, wherein the first signal has a pulse width greater than a pulse width of the second signal and greater than a pulse width of the third signal.

Example 22: The apparatus of example 20, wherein the third signal de-asserts prior to an assertion of the second signal.

Example 23: The apparatus of example 20, wherein the first transistor is a first n-type transistor, wherein the second transistor is a second n-type transistor, and wherein the third transistor is a p-type transistor.

Example 24: The apparatus of example 20, wherein the first transistor, the second transistor, and the third transistor are disabled in an evaluation phase, and enabled in a reset phase, wherein the reset phase is prior to the evaluation phase.

Example 25: A system comprising: a processor; a communication interface communicatively coupled to the processor; and a memory coupled to the processor, wherein the processor comprises a sequential circuitry which includes: a 3-input majority gate having a first, second, and third inputs, and a first output; a driver coupled to the first output, wherein the driver is to generate a second output; and compare logic to receive a clock and the second output, wherein the compare logic is to generate a third output which is coupled to the second input, wherein the first input is to receive a data, and wherein the third input is to receive the second output.

Example 26: The system of example 25, wherein the 3-input majority gate comprises: first, second, and third non-ferroelectric capacitors coupled to the first input, the second input, and the third input, respectively; and a non-linear polar capacitor to store a majority function output of the first, second, and third inputs, wherein one terminal of the non-linear polar capacitor provides the first output, wherein the compare logic comprises an exclusive-OR (XOR) gate.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a 3-input majority logic gate comprising:
first, second, and third non-ferroelectric capacitors to receive a first input, a second input, and a third input, respectively; and
a non-linear polar capacitor to store a majority function output of the first, second, and third inputs, wherein one terminal of the non-linear polar capacitor provides an output of the 3-input majority logic gate;
a driver coupled to the output of the 3-input majority logic gate, wherein the driver is to generate an amplified output of the 3-input majority logic gate, wherein the amplified output is coupled to the third input; and
a compare logic to receive an input clock and the amplified output, wherein an output of the compare logic is the second input.

2. The apparatus of claim 1, wherein the first input is a data input.

3. The apparatus of claim 1, wherein the driver comprises one of: a buffer, an amplifier, NAND, AND, OR, multiplexer, or NOR logic gates, wherein the compare logic comprises an exclusive-OR (XOR) gate.

4. The apparatus of claim 1, comprising:
a first transistor coupled to a first terminal of the non-linear polar capacitor, wherein the first transistor is controllable by a first clock;
a second transistor coupled to a second terminal of the non-linear polar capacitor, wherein the second transistor is controllable by a second clock; and
a third transistor coupled to the second terminal of the non-linear polar capacitor, wherein the third transistor is controllable by a third clock.

5. The apparatus of claim 4, wherein the first clock has a pulse width greater than a pulse width of the second clock and a pulse width of the third clock.

6. The apparatus of claim 4, wherein the third clock de-asserts prior to an assertion of the second clock.

7. The apparatus of claim 4, wherein the first transistor is a first n-type transistor, wherein the second transistor is a second n-type transistor, and wherein the third transistor is a p-type transistor.

8. The apparatus of claim 4, wherein the first transistor, the second transistor, and the third transistor are disabled in an evaluation phase, and enabled in a reset phase, wherein the reset phase is prior to the evaluation phase.

9. The apparatus of claim 4, wherein the first and second clocks are same, and wherein the first and second clocks are reset signals.

10. The apparatus of claim 4, wherein the first and second clocks are different signals.

11. The apparatus of claim 1 comprises:
a first driver to generate the first input; and
a second driver to generate the input clock.

12. The apparatus of claim 11, wherein the first and second drivers comprise CMOS transistors.

13. The apparatus of claim 1, wherein the first, second, and third non-ferroelectric capacitors of the 3-input majority logic gate comprise one of: metal-insulator-metal (MIM) capacitor, transistor gate capacitor, hybrid of metal and transistor capacitor; or capacitor comprising para-electric material.

14. The apparatus of claim 1, wherein the non-linear polar capacitor includes one of: ferroelectric material, para-electric material, or non-linear dielectric material.

15. The apparatus of claim 14, wherein the ferroelectric material includes one of:
Bismuth ferrite (BFO), BFO with a doping material where in the doping material is one of Lanthanum, or elements from lanthanide series of a periodic table;
Lead zirconium titanate (PZT), or PZT with a doping material, wherein the doping material is one of La or Nb;
a relaxor ferro-electric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
perovskite ferroelectrics which includes one of: $BaTiO_3$, $PbTiO_3$, $KNbO_3$, or $NaTaO_3$;
hexagonal ferroelectric includes one of: $YMnO_3$ or $LuFeO_3$;
hexagonal ferroelectrics of a type h-RMnO3, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
Hafnium (Hf), Zirconium (Zr), Aluminum (Al), Silicon (Si), their oxides or their alloyed oxides;
Hafnium oxides of a form, $Hf_{1-x} E_x O_y$ where E can be Al, Ca, Ce, Dy, er, Gd, Ge, La, Sc, Si, Sr, Sn, or Y;
$Al(1-x)Sc(x)N$, $Ga(1-x)Sc(x)N$, $Al(1-x)Y(x)N$ or $Al(1-x-y)Mg(x)Nb(y)N$, y doped $HfO_2$, where x includes one of: Al, Ca, Ce, Dy, Er, Gd, Ge, La, Sc, Si, Sr, Sn, or Y, wherein 'x' is a fraction;
Niobate type compounds which include $LiNbO_3$, $LiTaO_3$, Lithium iron Tantalum Oxy Fluoride, Barium Strontium Niobate, Sodium Barium Niobate, or Potassium strontium niobate; or
an improper ferroelectric which includes one of: [PTO/STO]n or [LAO/STO]n, where 'n' is between 1 to 100.

16. The apparatus of claim 1, wherein the non-linear polar capacitor is positioned in a backend of a die, while transistors of the driver and the compare logic are positioned in a frontend of a die.

17. An apparatus comprising:
- a 3-input majority gate having first, second, and third inputs, and a first output;
- a driver coupled to the first output, wherein the driver is to generate a second output; and
- a compare logic to receive a clock and the second output, wherein the compare logic is to generate a third output which is coupled to the second input, wherein the first input is to receive a data, and wherein the third input is to receive the second output.

18. The apparatus of claim 17, wherein the 3-input majority gate comprises:
- first, second, and third non-ferroelectric capacitors coupled to the first input, the second input, and the third input, respectively; and
- a non-linear polar capacitor to store a majority function output of the first, second, and third inputs, wherein one terminal of the non-linear polar capacitor provides the first output.

19. The apparatus of claim 17, wherein the driver comprises one of: a buffer, amplifier, NAND, AND, OR, multiplexer, or NOR logic gates, wherein the compare logic comprises an exclusive-OR (XOR) gate.

20. The apparatus of claim 18, comprising:
- a first transistor coupled to a first terminal of the non-linear polar capacitor, wherein the first transistor is controllable by a first signal;
- a second transistor coupled to a second terminal of non-linear polar capacitor, wherein the second transistor is controllable by a second signal; and
- a third transistor coupled to the second terminal of the non-linear polar capacitor, wherein the third transistor is controllable by a third signal.

21. The apparatus of claim 20, wherein the first signal has a pulse width greater than a pulse width of the second signal and greater than a pulse width of the third signal.

22. The apparatus of claim 20, wherein the third signal de-asserts prior to an assertion of the second signal.

23. The apparatus of claim 20, wherein the first transistor is a first n-type transistor, wherein the second transistor is a second n-type transistor, and wherein the third transistor is a p-type transistor.

24. The apparatus of claim 20, wherein the first transistor, the second transistor, and the third transistor are disabled in an evaluation phase, and enabled in a reset phase, wherein the reset phase is prior to the evaluation phase.

25. A system comprising:
- a processor;
- a communication interface communicatively coupled to the processor; and
- a memory coupled to the processor, wherein the processor comprises a sequential circuitry which includes:
  - a 3-input majority gate having a first, second, and third inputs, and a first output;
  - a driver coupled to the first output, wherein the driver is to generate a second output; and
  - compare logic to receive a clock and the second output, wherein the compare logic is to generate a third output which is coupled to the second input, wherein the first input is to receive a data, and wherein the third input is to receive the second output.

26. The system of claim 25, wherein the 3-input majority gate comprises:
- first, second, and third non-ferroelectric capacitors coupled to the first input, the second input, and the third input, respectively; and
- a non-linear polar capacitor to store a majority function output of the first, second, and third inputs, wherein one terminal of the non-linear polar capacitor provides the first output,
- wherein the compare logic comprises an exclusive-OR (XOR) gate.

* * * * *